(12) United States Patent
Saito

(10) Patent No.: US 8,654,567 B2
(45) Date of Patent: Feb. 18, 2014

(54) SEMICONDUCTOR MEMORY DEVICE

(75) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 197 days.

(21) Appl. No.: 13/277,377

(22) Filed: Oct. 20, 2011

(65) Prior Publication Data

US 2012/0106226 A1    May 3, 2012

(30) Foreign Application Priority Data

Oct. 29, 2010 (JP) ................ 2010-242925
May 20, 2011 (JP) ................ 2011-113233

(51) Int. Cl.
*G11C 11/24* (2006.01)
(52) U.S. Cl.
USPC ............. 365/149; 365/210.13; 365/207
(58) Field of Classification Search
USPC ................. 365/149, 210.13, 207
See application file for complete search history.

(56) References Cited

U.S. PATENT DOCUMENTS

| | | | |
|---|---|---|---|
| 7,126,868 B2* | 10/2006 | Mizuno et al. | 365/203 |
| 7,605,410 B2 | 10/2009 | Takano et al. | |
| 7,613,024 B2* | 11/2009 | Manning et al. | 365/63 |
| 2006/0007725 A1* | 1/2006 | Ozeki | 365/145 |
| 2010/0038618 A1 | 2/2010 | Takano et al. | |
| 2010/0155799 A1 | 6/2010 | Yokoyama | |
| 2012/0033483 A1 | 2/2012 | Koyama | |

FOREIGN PATENT DOCUMENTS

JP    2010-147392 A    7/2010

* cited by examiner

*Primary Examiner* — Vu Le
*Assistant Examiner* — Han Yang
(74) *Attorney, Agent, or Firm* — Fish & Richardson P.C.

(57) ABSTRACT

A semiconductor memory device includes a bit line; two or more word lines; and a memory cell including two or more sub memory cells that each include a transistor and a capacitor. One of a source and a drain of the transistor is connected to the bit line, the other of the source and the drain of the transistor is connected to the capacitor, a gate of the transistor is connected to one of the word lines, and each of the sub memory cells has a different capacitance of the capacitor.

7 Claims, 26 Drawing Sheets

● In
○ Sn
◌ Zn
• O

SEMICONDUCTOR MEMORY DEVICE

BACKGROUND OF THE INVENTION

1. Field of the Invention

The present invention relates to a semiconductor memory device.

2. Description of the Related Art

A dynamic random access memory (DRAM) is a semiconductor memory device capable of holding data for one bit with the use of one transistor and one capacitor. In the DRAM, the area per unit memory cell is small, integration for making a module is easy, and manufacturing cost is low.

In the DRAM, charge accumulated in the capacitor leaks due to off-state current of the transistor; therefore, there has been a need for recharging (refreshing) before necessary charge is lost.

REFERENCE

Patent Document

[Patent Document 1] Japanese Published Patent Application No. 2010-147392

SUMMARY OF THE INVENTION

Description will be made using a circuit diagram of a DRAM in FIG. 11A. The DRAM includes a bit line BL, a word line WL, a sense amplifier SAmp, a transistor Tr, and a capacitor C.

The charge held in the capacitor C is gradually decreased over time as shown in FIG. 11B due to leakage through the transistor Tr. After a certain period of time, the potential originally charged from V0 to V1 is decreased to VA which is a limit for reading data 1. This period is called a holding period T_1. In the case of a two-level memory cell, refresh needs to be performed within the holding period T_1.

The invention disclosed in Patent Document 1 proposes that a structure of a transistor in which a channel is formed in a semiconductor substrate of silicon is devised to reduce the off-state current. However, it is difficult to sufficiently reduce the off-state current of the transistor. Therefore, in a conventional DRAM, even in the case where held data is not rewritten, a memory element needs to be refreshed at predetermined intervals (e.g., several tens of times per second).

Even if a DRAM is miniaturized, there is a limit to the amount of increase in the storage capacity of a memory module per unit area, and multi-level cell operation in which plural data are held in one memory cell is required.

Next, three-level memory cell capable of reading data 1 and data 2 will be described. In FIG. 11C, the limit for reading data 2 is V1, and the period during which data 2 can be read is called a holding period T_2. It can be seen that the holding period T_2 is shorter than the holding period T_1 of the two-level memory cell. Therefore, the refresh frequency needs to be increased. Therefore, a multi-level memory cell is hard to realize in consideration of the reading accuracy.

In view of the above, it is an object to increase the storage capacity of a memory module per unit area.

Further, it is an object to provide a memory module with low power consumption.

The storage capacity of a memory module per unit area is increased by multi-level cell operation and a layered structure of a memory cell.

An embodiment of the present invention is a semiconductor memory device which includes a bit line; two or more word lines; and a memory cell including two or more sub memory cells that each include a transistor and a capacitor. One of a source and a drain of the transistor is connected to the bit line, the other of the source and the drain of the transistor is connected to the capacitor, a gate of the transistor is connected to one of the word lines, and each of the sub memory cells has a different capacitance of the capacitor.

Charge of the capacitor is lost due to the off-state current of the transistor. The off-state current is a current flowing between the source and the drain of the transistor in an off state. By flow of the off-state current, charge accumulated in the capacitor is lost over time. To avoid such a phenomenon, a transistor with small off-state current can be used, so that the holding period of the potential of the capacitor can be extended.

The off-state current of the transistor is generated due to recombination of carriers in a semiconductor film. Therefore, as the band gap of the semiconductor film is wider or as the amount of impurities serving as recombination centers of carriers is smaller, the off-state current is less likely to flow. For example, a purified oxide semiconductor film, a purified silicon carbide film, a purified gallium nitride film, or the like, which has a band gap of 2.5 eV or more, preferably 2.8 eV or more, and further preferably 3 eV or more may be used in the transistor.

In particular, the oxide semiconductor film can be easily formed with a sputtering apparatus or the like, and a transistor according to one embodiment of the present invention in which the oxide semiconductor film is used as an active layer can realize small off-state current; thus, the oxide semiconductor film is a material suitable for implementing the present invention. For example, the off-state current of a transistor including an In—Ga—Zn—O-based oxide semiconductor film is $1 \times 10^{-18}$ A or less. The off-state current of a transistor including a purified In—Ga—Zn—O-based oxide semiconductor film is $1 \times 10^{-21}$ A or less, and that of a transistor including an In—Ga—Zn—O-based oxide semiconductor film with a smaller amount of impurities can be as small as $1 \times 10^{-24}$ A or less. This value of off-state current is really $1/10^{14}$ to $1/10^{8}$ of that of a transistor in which a channel is formed in a semiconductor substrate of silicon, and the charge holding period of a capacitor can be $10^8$ times to $10^{14}$ times.

Thus, by using a transistor with small off-state current, charge of a capacitor can be held for a long period even in the case where the refresh frequency is reduced.

By reduction of the refresh frequency, power consumption can be reduced.

Furthermore, since loss of charge hardly occurs, a small difference of capacitance can be identified; accordingly, the size of the capacitor can be reduced. The miniaturization of a memory cell can realize smaller area of a memory module.

Furthermore, in the case where two or more sub memory cells including capacitors with different capacitances are combined to form a memory cell, a multi-level memory cell utilizing the capacitance difference can be realized.

For example, a first sub memory cell including a capacitor with a capacitance C1, (a second sub memory cell including a capacitor with a capacitance C2) to an n-th sub memory cell (n is a natural number of 2 or more) including a capacitor with a capacitance Cn form a memory cell. Here, when the capacitances are set to satisfy the following relation: $C1(:C2):Cn=1(2):2^{n-1}$, $2^n$ levels of potentials can be held in a memory cell; in this manner, a $2^n$-level memory cell can be manufactured. Note that the area of a capacitor has to be increased in accordance with increase in the value of n. For this reason, the increase in the value of n is sometimes disadvantageous in terms of reduction of the area. In addition, it sometimes becomes difficult to read the potentials. Thus, it is preferable to set n to be in an appropriate range. For example, n may be 2 to 8, preferably 3 to 5.

In one embodiment of the present invention, a memory cell can be formed by making the sub memory cells overlap with each other. This is because an oxide semiconductor film can be formed by a sputtering method or the like. The memory cell having a small area can be manufactured by overlap of the sub memory cells; accordingly, the storage capacity of a memory module per unit area can be further increased.

Alternatively, a structure in which memory cells are provided to overlap with each other may be employed. The area of the capacitor largely contributes to the size of the sub memory cell. In the case where the sub memory cell including a capacitor with the largest capacitance (also referred to as a largest sub memory cell) and the sub memory cell including a capacitor with the smallest capacitance (also referred to as a smallest sub memory cell) overlap with each other, the area of the $2^n$-level memory cell is the size of the largest sub memory cell. In other words, in the case where a module is formed by arranging memory cells, the number of integrated memory cells depends on the area of the largest sub memory cell. Alternatively, a structure in which sub memory cells are arranged in the same layer to form a memory cell and then a memory cell with the same size is provided to overlap with the memory cell may be employed, in which waste of space is hardly generated in forming a module. This can further increase the storage capacity of a memory module per unit area.

A semiconductor device which is one embodiment of the present invention includes a bit line; two or more word lines; a memory cell including two or more sub memory cells that each include a transistor and a capacitor; a first selection transistor; a second selection transistor; an amplifier; a first selection line; a second selection line; and a sub bit line. A gate of the first selection transistor is connected to the first selection line, one of a source and a drain of the first selection transistor is connected to the bit line, and the other of the source and the drain of the first selection transistor is connected to the sub bit line. The first selection transistor, one of a source and a drain of the transistor in each sub memory cell, and one terminal of the amplifier are connected to each other through the sub bit line. The other terminal of the amplifier is connected to one of a source and a drain of the second selection transistor, and the other of the source and the drain of the second selection transistor is connected to the bit line. A gate of the second selection transistor is connected to the second selection line. The other of the source and the drain of the transistor is connected to the capacitor, and a gate of the transistor is connected to one of the word lines. Each of the sub memory cells has a different capacitance of the capacitor.

In a conventional DRAM, at the time of reading, a capacitor in a memory cell needs to have a certain capacitance owing to the existence of parasitic capacitance of a bit line. By providing a sub bit line for each memory cell as in one embodiment of the present invention, the influence of the parasitic capacitance of the bit line at the time of reading can be reduced. That is, identification of data in the case of multi-level cell operation is facilitated. Accordingly, the capacitance of the capacitor in the memory cell can be further reduced.

The storage capacity of a memory module per unit area can be increased by multi-level cell operation and a layered structure of a memory cell.

By reduction of the refresh frequency, power consumption of a memory module can be reduced.

DETAILED DESCRIPTION OF THE INVENTION

Figure 1:
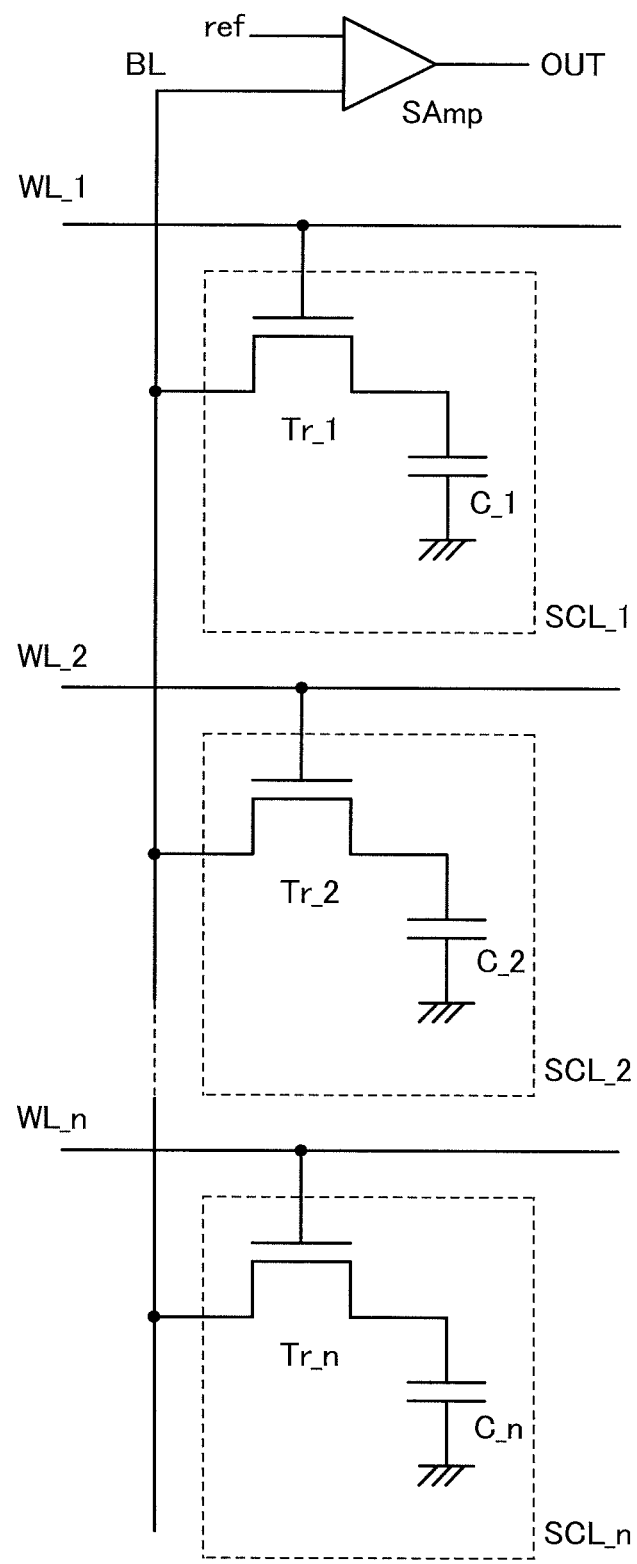
FIG. 1 is a circuit diagram illustrating an example of a semiconductor memory device.
Figure 2A:
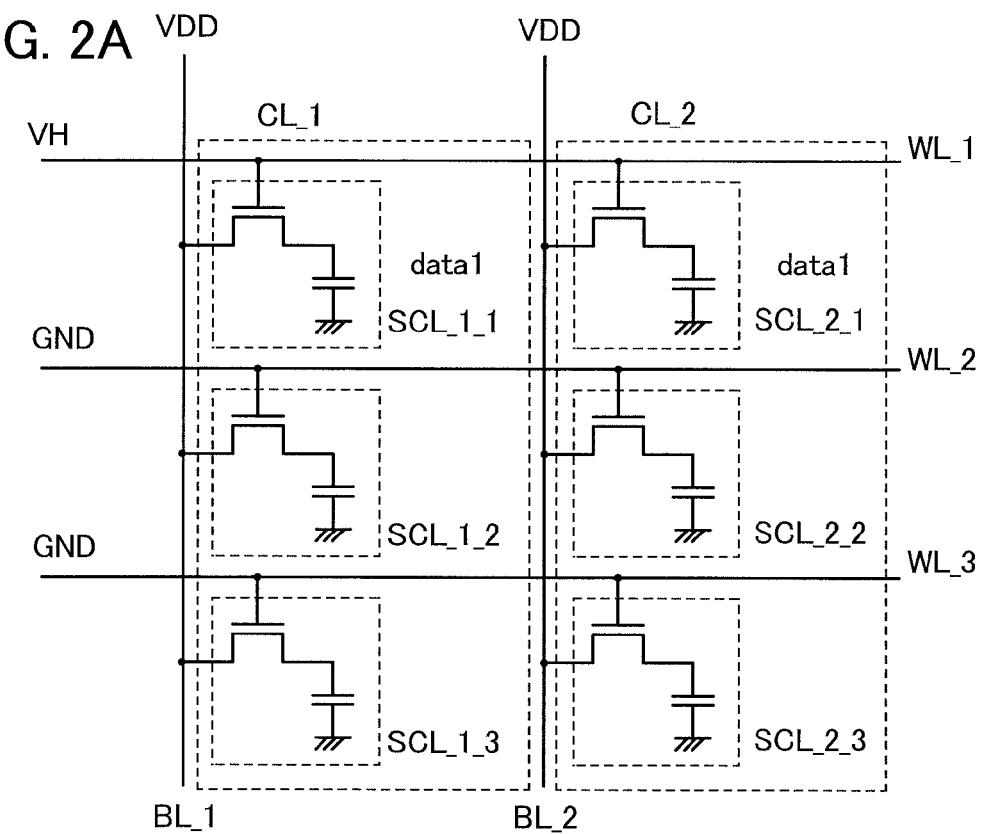
FIGS. 2A and 2B are circuit diagrams illustrating writing of a semiconductor memory device.
Figure 2B:
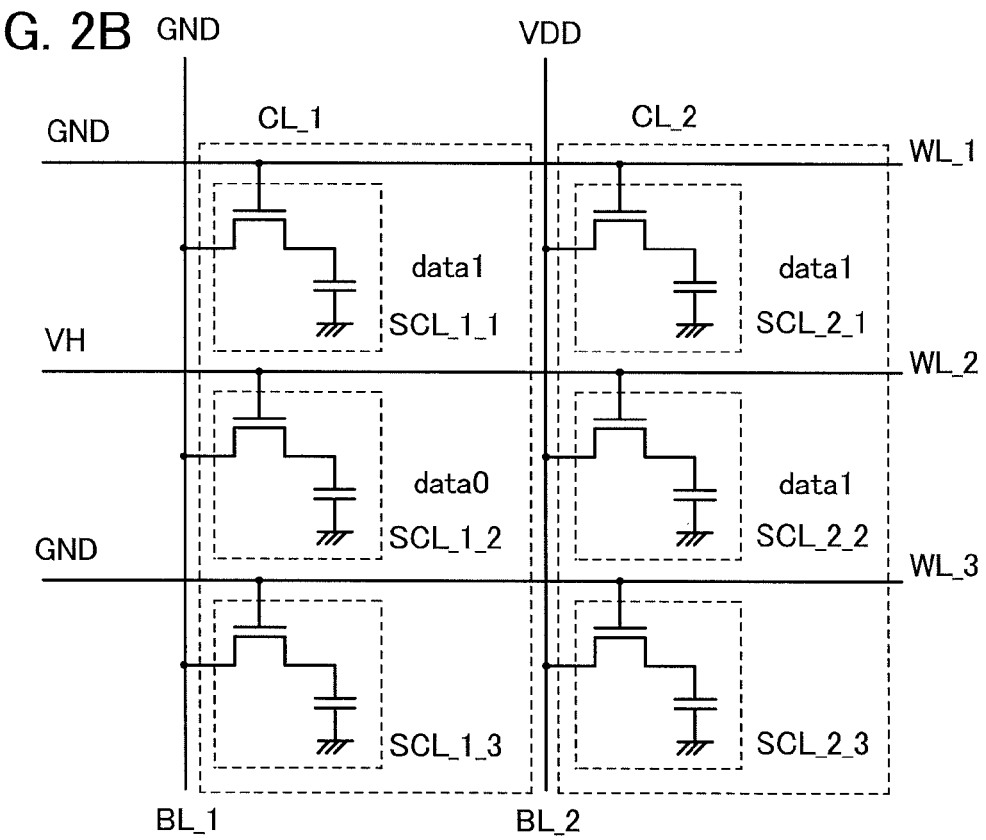

Hereinafter, embodiments of the present invention will be described in detail with reference to the accompanying drawings. However, the present invention is not limited to the following description, and it is easily understood by those skilled in the art that modes and details can be modified in various ways. Therefore, the present invention is not construed as being limited to description of the embodiments below. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" are used for convenience and do not denote the order of steps or the stacking order of layers. In addition, the ordinal numbers in this specification do not denote particular names which specify the present invention.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

Even when it is written in this specification that "to be connected", there is a case in which no physical connection is made in an actual circuit and a wiring is only extended. For example, in the case of a circuit including an insulated-gate field-effect transistor (MISFET), one wiring functions as gates of a plurality of MISFETs in some cases. In that case, one wiring which branches into gates may be illustrated in a circuit diagram. Even in such a case, the expression "a wiring is connected to a gate" may be used in this specification.

Note that in this specification, in referring to a specific row, a specific column, or a specific position in a matrix, a reference sign is accompanied by a sign denoting coordinates as follows, for example: "a first selection transistor STr1_n_m", "a bit line BL_m", and "a sub bit line SBL_n_m". In the case where a row, a column, or a position is not specified, the case where elements are collectively referred to, or the case where the position is obvious, the following expressions may be used: "a first selection transistor STr1", "a bit line BL", and "a sub bit line SBL" or simply "a first selection transistor", "a bit line", and "a sub bit line".

Embodiment 1

In this embodiment, an example of a structure of a memory cell which is a semiconductor memory device and its operation example will be described with reference to FIG. 1.

FIG. 1 is a circuit diagram of a memory cell including a bit line BL, word lines WL_1, (WL_2) to WL_n, transistors Tr_1, (Tr_2) to Tr_n, capacitors C_1, (C_2) to C_n, and a sense amplifier SAmp.

A gate of the transistor Tr_1 is connected to the word line WL_1, one of a source and a drain of the transistor Tr_1 is connected to the bit line BL, the other of the source and the drain of the transistor Tr_1 is connected to one terminal of the capacitor C_1, and the other terminal of the capacitor C_1 is connected to GND. Similarly, a gate of the transistor Tr_2 is connected to the word line WL_2, one of a source and a drain of the transistor Tr_2 is connected to the bit line BL, the other of the source and the drain of the transistor Tr_2 is connected to one terminal of the capacitor C_2, and the other terminal of the capacitor C_2 is connected to GND. Similarly, a gate of the transistor Tr_n is connected to the word line WL_n, one of a source and a drain of the transistor Tr_n is connected to the bit line BL, the other of the source and the drain of the transistor Tr_n is connected to one terminal of the capacitor C_n, and the other terminal of the capacitor C_n is connected to GND. The bit line BL is connected to the sense amplifier SAmp. Note that connection to GND means grounding.

Here, a structure in which one transistor is connected to one capacitor is called a sub memory cell SCL. Specifically, a structure including the transistor Tr_1 and the capacitor C_1 is a sub memory cell SCL_1, a structure including the transistor Tr_2 and the capacitor C_2 is a sub memory cell SCL_2, and a structure including the transistor Tr_n and the capacitor C_n is a sub memory cell SCL_n.

For the transistors Tr_1, (Tr_2) to Tr_n, transistors with small off-state current are used. Specifically, transistors in which a semiconductor film such as a purified oxide semiconductor film, a purified silicon carbide film, or a purified gallium nitride film, which has a band gap of 2.5 eV or more, preferably 2.8 eV or more, and further preferably 3 eV or more is used as an active layer may be used. The above-described semiconductor film has a wide band gap and a small number of impurity levels, so that recombination of carriers is hardly caused and the off-state current is small.

By using a transistor with small off-state current in a sub memory cell, a change in the potential held in a capacitor can be suppressed. Accordingly, the potential holding period is extended and thus the refresh frequency can be reduced, which allows power consumption to be reduced. Further, since the change in the potential can be suppressed, it is possible to reduce the capacitance of the capacitor; accordingly, the area of the memory cell can be reduced.

Furthermore, by adjusting the capacitance of the capacitor in each sub memory cell, a plurality of potential levels can be set. In other words, a multi-level memory cell can be manufactured.

For example, when the capacitances are set to satisfy the following relation: $C\_1(:C\_2):C\_n=1(:2):2^{n-1}$ (n is a natural number of 2 or more), $2^n$ levels of potentials can be held. At this time, the capacitance of the capacitor C_1 with the smallest capacitance is preferably set to be more than or equal to 0.1 fF and less than or equal to 1 fF. Note that the area of a capacitor has to be increased in accordance with increase in the value of n. For this reason, the increase in the value of n is sometimes disadvantageous in terms of reduction of the area. In addition, it sometimes becomes difficult to read the potentials. Thus, it is preferable to set n to be in an appropriate range. For example, n may be 2 to 8, preferably 3 to 5.

For example, when n is 3 and when the capacitance of the capacitor C_1 is 1 fF, the capacitance of the capacitor C_2 is 2 fF, and the capacitance of the capacitor C_3 is 4 fF, a writing method is as follows.

Writing to the capacitors can be performed independently: the bit line may be set to a predetermined potential VDD (a potential sufficient for charging the capacitors) and VH may be applied to the word line connected to the sub memory cell including the capacitor on which writing is performed. In this specification, VH is higher than a voltage obtained by adding VDD to the threshold voltage ($V_{th}$) of the transistor. Table 1 shows combinations of the potentials of the word lines and the capacitance of the capacitor.

TABLE 1

| WL_1 | WL_2 | WL_3 | capacitance of capacitor [fF] |
|---|---|---|---|
| GND | GND | GND | 0 |
| VH | GND | GND | 1 |
| GND | VH | GND | 2 |

TABLE 1-continued

| WL_1 | WL_2 | WL_3 | capacitance of capacitor [fF] |
|------|------|------|-------------------------------|
| VH   | VH   | GND  | 3                             |
| GND  | GND  | VH   | 4                             |
| VH   | GND  | VH   | 5                             |
| GND  | VH   | VH   | 6                             |
| VH   | VH   | VH   | 7                             |

The sense amplifier detects the accumulated potential; thus, 3-bit (8-level) data can be read. That is, when n is 3, an 8-level memory cell can be manufactured.

In the case of using a conventional transistor in which a channel is formed in a semiconductor substrate of silicon, the off-state current is large and the potential cannot be held, so that a multi-level memory cell is hard to realize. However, in the case of using a transistor with small off-state current, a multi-level memory cell can be realized.

This embodiment can be combined with any of the other embodiments as appropriate.

Embodiment 2

In this embodiment, an example of a structure of a memory cell which is a semiconductor memory device and its operation example, which are different from those of Embodiment 1, will be described with reference to FIG. 4.

Figure 4:
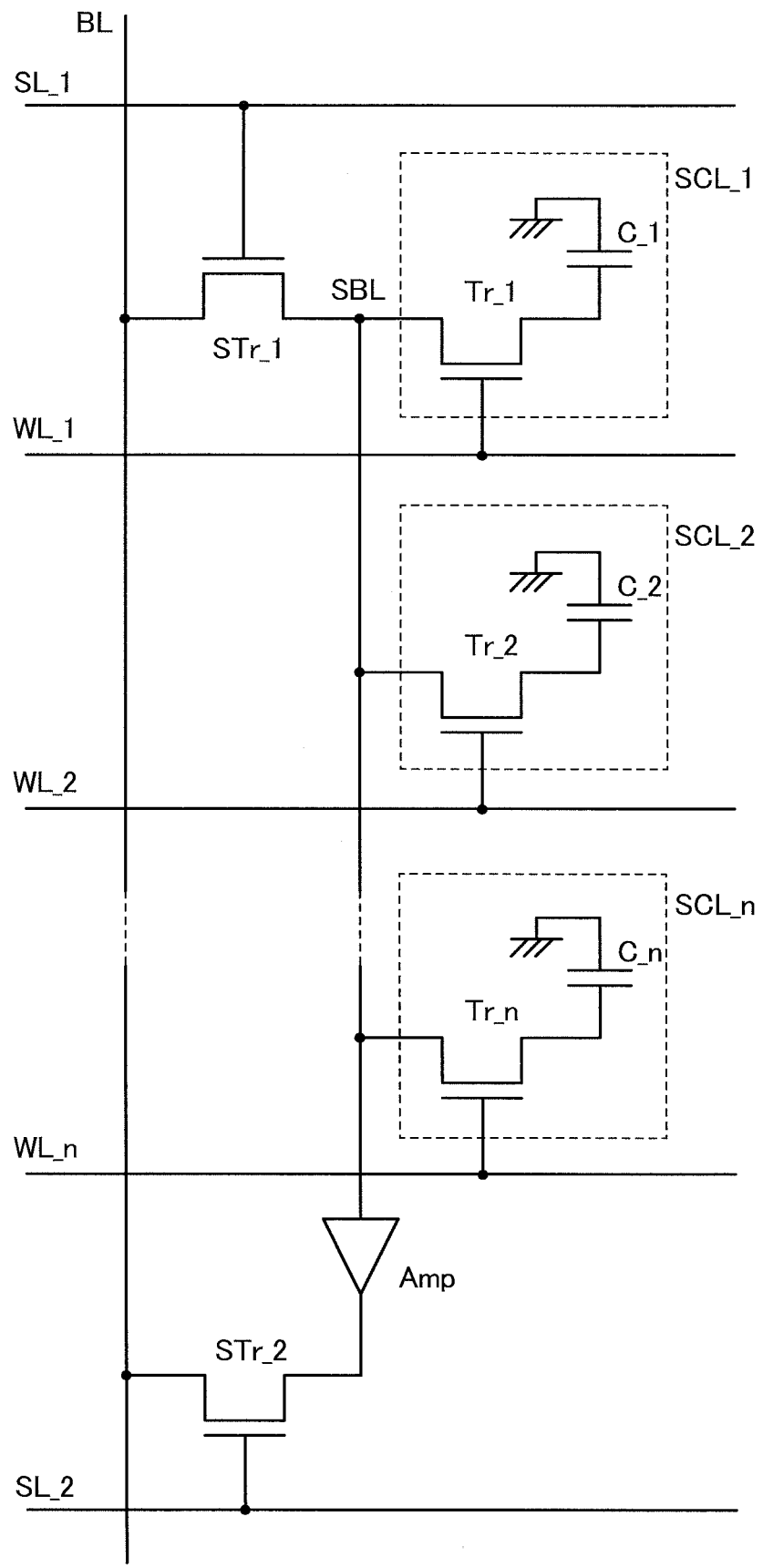
FIG. 4 is a circuit diagram illustrating an example of a semiconductor memory device.

FIG. 4 is a circuit diagram of a memory cell including a bit line BL, a sub bit line SBL, a first selection line SL_1, a second selection line SL_2, word lines WL_1, (WL_2) to WL_n, a first selection transistor STr_1, a second selection transistor STr_2, transistors Tr_1, (Tr_2) to Tr_n, capacitors C_1, (C_2) to C_n, and an amplifier Amp.

The transistors Tr_1, (Tr_2) to Tr_n, the capacitors C_1, (C_2) to C_n, and the sub memory cells SCL_1, (SCL_2) to SCL_n may have structures similar to those in Embodiment 1.

One of a source and a drain of the first selection transistor STr_1 is connected to the bit line BL. The other of the source and the drain of the first selection transistor STr_1 is connected to one of a source and a drain of the transistor Tr_1, (one of a source and a drain of the transistor Tr_2), and one of a source and a drain of the transistor Tr_n through the sub bit line SBL and is also connected to one of a source and a drain of the second selection transistor STr_2 through the amplifier Amp. The other of the source and the drain of the second selection transistor STr_2 is connected to the bit line BL.

The physical distance of the sub bit line can be shortened as compared to the bit line; accordingly, parasitic capacitance can be reduced. Therefore, even with a small capacitance of a memory cell, a signal can be amplified without causing a malfunction and the amplified signal can be output to the bit line.

Thus, the capacitance of the capacitor in the sub memory cell can be made less than that of Embodiment 1, so that the area of the memory cell can be reduced. Specifically, the capacitance of the capacitor can be reduced to be more than or equal to 0.1 fF and less than or equal to 1 fF. Needless to say, the capacitance of the capacitor may be more than 1 fF.

Further, since one amplifier is connected to one sub bit line, potential identification can be performed without particularly providing a sense amplifier. Needless to say, a structure with a sense amplifier may also be used in a manner similar to that of Embodiment 1.

With this embodiment, the potential holding period is extended and thus the refresh frequency can be reduced, which allows power consumption to be reduced. Further, since the change in the potential can be suppressed and furthermore the capacitances of the capacitors can be reduced by provision of the sub bit line, the area of the memory cell can be further reduced.

This embodiment can be combined with any of the other embodiments as appropriate.

Embodiment 3

In this embodiment, a memory module including n rows and m columns (n and m are each a natural number of 3 or more) and using the memory cell described in Embodiment 1 will be described as an example of a semiconductor memory device with reference to FIG. 5.

Figure 5:
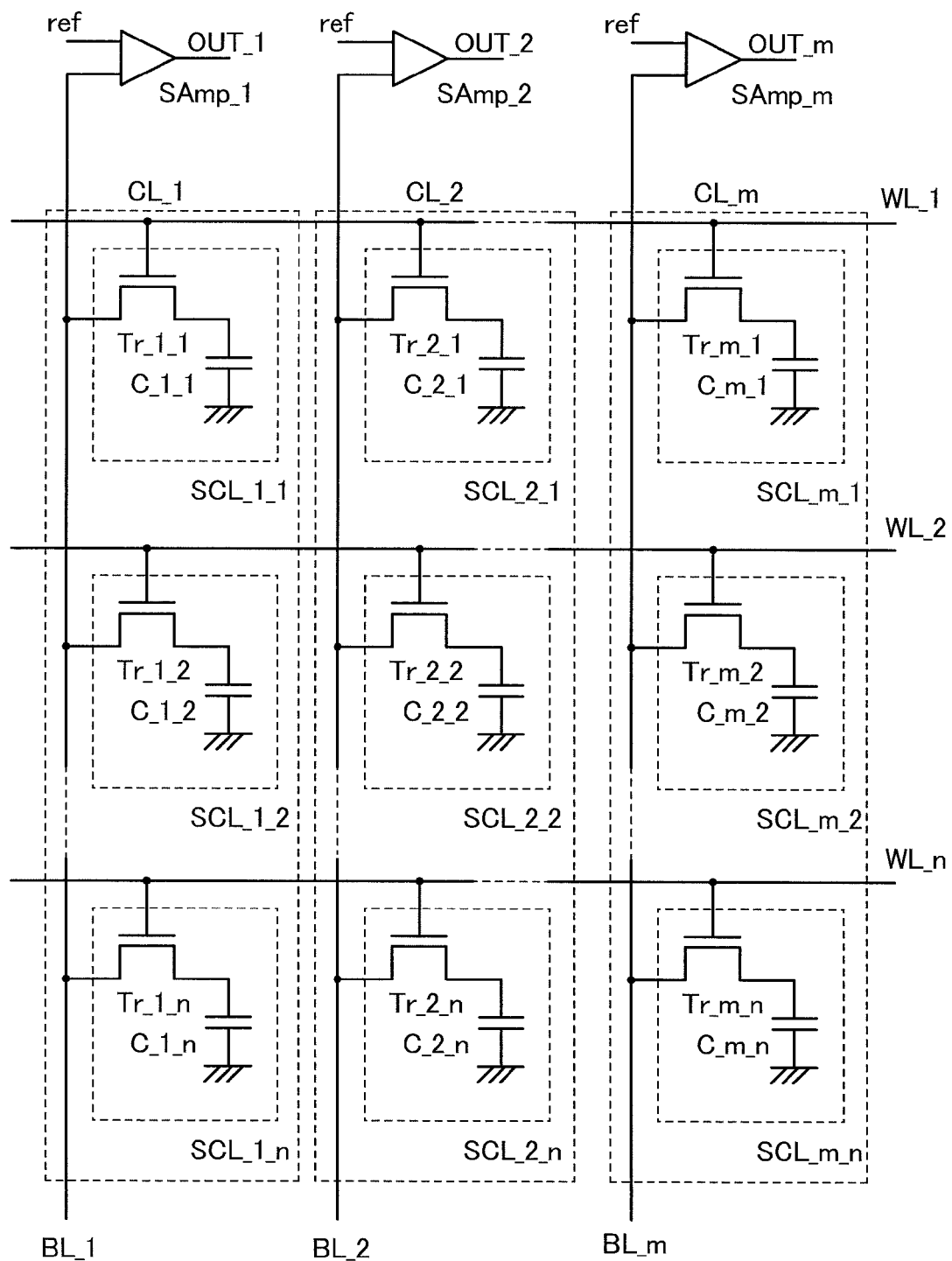
FIG. 5 is a circuit diagram illustrating an example of a module of a semiconductor memory device.

FIG. 5 illustrates a memory module including bit lines BL_1, BL_2, to BL_m, word lines WL_1, WL_2, to WL_n, transistors Tr_1_1 to Tr_m_n, capacitors C_1_1 to C_m_n, and sense amplifiers SAmp_1, SAmp_2, to SAmp_m.

Each of the transistors, the capacitors, and sub memory cells (SCL_1_1 to SCL_m_n) may have a structure similar to that in Embodiment 1.

A structure of a memory cell CL_1 will be described. A gate of the transistor Tr_1_1 is connected to the word line WL_1, one of a source and a drain of the transistor Tr_1_1 is connected to the bit line BL_1, the other of the source and the drain of the transistor Tr_1_1 is connected to one terminal of the capacitor C_1_1, and the other terminal of the capacitor C_1_1 is connected to GND. Similarly, a gate of the transistor Tr_1_2 is connected to the word line WL_2, one of a source and a drain of the transistor Tr_1_2 is connected to the bit line BL_1, the other of the source and the drain of the transistor Tr_1_2 is connected to one terminal of the capacitor C_1_2, and the other terminal of the capacitor C_1_2 is connected to GND. Similarly, a gate of the transistor Tr_1_n is connected to the word line WL_n, one of a source and a drain of the transistor Tr_1_n is connected to the bit line BL_1, the other of the source and the drain of the transistor Tr_1_n is connected to one terminal of the capacitor C_1_n, and the other terminal of the capacitor C_1_n is connected to GND. The bit line BL_1 is connected to the sense amplifier SAmp_1.

The memory cells CL_2 to CL_m may be formed in a manner similar to that of the memory cell CL_1, except the bit line and the sense amplifier. That is, although the bit lines BL_2 to BL_m and the sense amplifiers SAmp_2 to SAmp_m are used for the memory cells CL_2 to CL_m, respectively, one word line is shared by sub memory cells in the same row. Specifically, gates of the transistors in the first row (Tr_1_1, Tr_2_1, to Tr_m_1) are connected to the word line WL_1, gates of the transistors in the second row (Tr_1_2, Tr_2_2, to Tr_m_2) are connected to the word line WL_2, and gates of the transistors in the n-th row (Tr_1_n, Tr_2_n, to Tr_m_n) are connected to the word line WL_n.

With this structure, a large-capacity memory module in which m number of $2^n$-level memory cells are connected can be manufactured.

In this embodiment, an example of connecting a plurality of memory cells having a similar structure to Embodiment 1 has been described; however, the present invention is not limited to this example. This embodiment can be implemented in combination with any of the other embodiments as appropriate, for example, using the memory cell described in Embodiment 2.

Embodiment 4

In this embodiment, an example of a manufacturing method of a memory cell which is a semiconductor memory device will be described with reference to FIG. 6.

Figure 6:
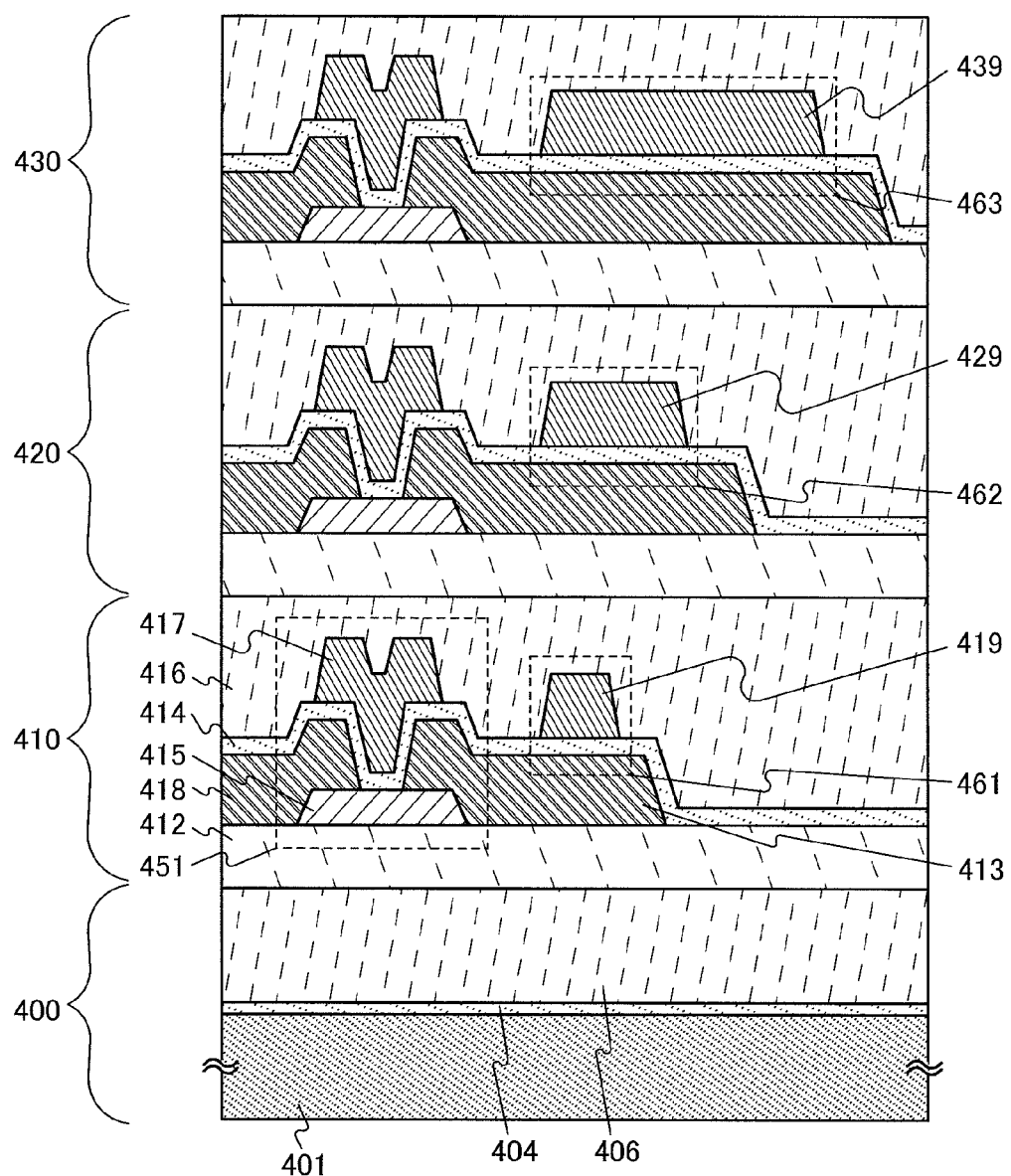
FIG. 6 illustrates a cross-sectional structure of a memory cell of a semiconductor memory device.

FIG. 6 is a cross-sectional view of a memory cell in which a sub memory cell 410, a sub memory cell 420, and a sub memory cell 430 overlap with each other. With an overlapping structure of the sub memory cells, the area of a memory cell can be reduced. Note that a sense amplifier, an amplifier, a bit line, and a word line are omitted for simplicity.

A region 400 is a region where a sense amplifier, an amplifier, or the like (not shown) is manufactured and includes a silicon wafer 401, a gate insulating film 404 over the silicon wafer 401, an interlayer film 406 over the gate insulating film 404, and the like. Note that the region 400 is not limited to the above-described structure. For example, a semiconductor substrate typified by a germanium substrate or a silicon on insulator (SOI) substrate may be used instead of the silicon wafer.

The gate insulating film 404 may be formed with a layered structure or a single-layer structure using, for example, silicon oxide, silicon oxynitride, silicon nitride oxide, silicon nitride, aluminum oxide, hafnium oxide, yttria-stabilized zirconia, or the like. For example, the gate insulating film 404 may be formed using a thermal oxidation method, a CVD method, a sputtering method, or the like.

The interlayer film 406 may be formed with a layered structure or a single-layer structure using, for example, silicon oxide, silicon oxynitride, silicon nitride oxide, silicon nitride, or the like. For example, the interlayer film 406 may be formed using a thermal oxidation method, a CVD method, a sputtering method, or the like.

It is preferable that a surface of the region 400 be planarized by chemical mechanical polishing (CMP) or the like because the sub memory cells can be easily formed to overlap with each other.

Next, the sub memory cell 410 is manufactured. The sub memory cell 410 includes a transistor 451 and a capacitor 461.

The transistor 451 includes a base film 412, a semiconductor film 415 over the base film 412, electrodes 413 and 418 each having a part that is in contact with the semiconductor film 415, a gate insulating film 414 having a part that is in contact with the semiconductor film 415 and covering the electrodes 413 and 418, and a gate electrode 417 provided over the semiconductor film 415 with the gate insulating film 414 interposed therebetween. Note that although the transistor 451 has a top-gate top-contact structure here, without limitation thereto, the transistor 451 may have a top-gate bottom-contact structure, a bottom-gate top-contact structure, or a bottom-gate bottom-contact structure.

The base film 412 may be formed with a layered structure or a single-layer structure using, for example, silicon oxide, silicon oxynitride, silicon nitride oxide, silicon nitride, or the like. For example, the base film 412 may be formed using a thermal oxidation method, a CVD method, a sputtering method, or the like. In the case where an oxide semiconductor film is used as the semiconductor film 415 described below, it is desirable to form an insulating film that releases oxygen by heat treatment with a thickness of 200 nm or more, preferably 300 nm or more. As the insulating film that releases oxygen by heat treatment, a silicon oxide film formed by a sputtering method can be given, for example. In the case where such an insulating film that releases oxygen by heat treatment is used as a base film, oxygen vacancies in the oxide semiconductor film can be filled and a transistor with favorable electrical characteristics and high reliability can be manufactured.

As the semiconductor film 415, a purified semiconductor film having a band gap of 2.5 eV or more, preferably 2.8 eV or more, and further preferably 3 eV or more is used. For example, an oxide semiconductor film, a silicon carbide film, a gallium nitride film, or the like may be used.

In the case of using an oxide semiconductor film, an oxide semiconductor film containing at least indium (In) or zinc (Zn) is preferably used. It is particularly preferable that the oxide semiconductor film contain In and Zn. As a stabilizer for reducing variation in electrical characteristics of a transistor including the oxide semiconductor film, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, a four-component metal oxide material such as an In—Sn—Ga—Zn—O-based material, an In—Hf—Ga—Zn—O-based material, an In—Al—Ga—Zn—O-based material, an In—Sn—Al—Zn—O-based material, an In—Sn—Hf—Zn—O-based material, or an In—Hf—Al—Zn—O-based material; a three-component metal oxide material such as an In—Ga—Zn—O-based material (also referred to as IGZO), an In—Sn—Zn—O-based material, an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O—based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like can be used. In addition, any of the above materials may contain silicon oxide. Here, for example, an In—Ga—Zn—O-based material means oxide containing indium (In), gallium (Ga), and zinc (Zn), and there is no particular limitation on the composition ratio. Further, the In—Ga—Zn—O-based material may contain an element other than In, Ga, and Zn.

The oxide semiconductor film may be formed using a thin film including a material expressed by a chemical formula $InMO_3(ZnO)_m$ (m>0). Here, M represents one or more metal elements selected from Ga, Al, Fe, Mn, and Co. For example, M may be Ga, Ga and Al, Ga and Mn, Ga and Co, or the like. For the oxide semiconductor film, a material expressed by $In_3SnO_5(ZnO)$, (n>0) may also be used.

For example, an oxide semiconductor film of an In—Ga—Zn—O-based material with an atomic ratio of In:Ga:Zn=1:1:1 or 2:2:1 or any of materials whose composition is in the neighborhood of the above compositions can be used. Alternatively, an oxide semiconductor film of an In—Sn—Zn—O-based material with an atomic ratio of In:Sn:Zn=1:1:1, 2:1:3, or 2:1:5, or any of materials whose composition is in the neighborhood of the above compositions may be used.

However, the composition of the oxide semiconductor film is not limited to those described above, and an oxide semiconductor film having an appropriate composition may be used depending on necessary semiconductor characteristics (e.g., mobility, threshold voltage). In order to obtain necessary semiconductor characteristics, it is preferable that the carrier concentration, the impurity concentration, the defect density, the atomic ratio of a metal element to oxygen, the interatomic distance, the density, and the like of the oxide semiconductor film be set to be appropriate.

For example, with the In—Sn—Zn—O-based material, a high mobility can be relatively easily obtained. However, the mobility can be increased by reducing the defect density in the bulk also in the case of using the In—Ga—Zn—O-based material.

Note that for example, the expression "the composition of an oxide semiconductor material including In, Ga, and Zn at the atomic ratio, In:Ga:Zn=a:b:c (a+b+c=1), is in the neighborhood of the composition of an oxide semiconductor material including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^{-2}$, and r may be 0.05, for example. The same applies to other oxide semiconductor materials.

The oxide semiconductor may be either single crystal or non-single-crystal. In the latter case, the oxide semiconductor may be either amorphous or polycrystal. Further, the oxide semiconductor does not necessarily have a completely amorphous structure and may include a crystalline region in an amorphous structure.

In the case of an oxide semiconductor film in an amorphous state, a flat surface can be obtained relatively easily, so that when a transistor is manufactured with the use of such an oxide semiconductor film, interface scattering can be reduced, and relatively high field-effect mobility can be obtained relatively easily.

In a transistor manufactured using an oxide semiconductor film having crystallinity, defects in the bulk can be further reduced and when surface flatness is improved, a field-effect mobility higher than that of an oxide semiconductor film in an amorphous state can be obtained. In order to improve the surface flatness, the oxide semiconductor film is preferably formed over a flat surface. Specifically, the oxide semiconductor film may be formed over a surface with an average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, center line average roughness that is defined by JIS B 0601 so as to be able to apply it to a surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \quad \text{[FORMULA 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

The oxide semiconductor film can be formed by a sputtering method, a PLD method, a spray method, or the like.

For example, a film of an In—Sn—Zn—O-based material can be formed by a sputtering method using a target with an atomic ratio of In:Sn:Zn=1:2:2, 2:1:3, 1:1:1, 20:45:35, or the like.

In particular, in the case of forming an oxide semiconductor film having high purity and a small number of defects by a sputtering method, the partial pressure of oxygen during the film formation is preferably more than or equal to 10%. Further, by setting the film formation temperature to be higher than or equal to 200° C. and lower than or equal to 450° C., the concentration of impurities (such as hydrogen) in the film can be reduced.

Further, if heat treatment is performed after the film formation, the purity of the oxide semiconductor film can become higher and the number of defects therein can become smaller. Specifically, heat treatment may be performed in a purified atmosphere of nitrogen, oxygen, or rare gas or a mixed atmosphere of these gases at a temperature higher than or equal to 150° C. and lower than a strain point of the substrate, preferably higher than or equal to 250° C. and lower than or equal to 450° C., for 6 minutes to 24 hours. The treatment time may be longer than 24 hours, but if the time is too long, the cost-effectiveness becomes low correspondingly.

The electrodes 413 and 418 may be formed from the same layer. As a material of the electrodes 413 and 418, a single metal such as aluminum, titanium, chromium, nickel, copper, yttrium, zirconium, molybdenum, silver, tantalum, or tungsten; an alloy thereof; or a metal nitride thereof.

Alternatively, as a material of the electrodes 413 and 418, a transparent conductive material including indium oxide, tin oxide, or zinc oxide may be used.

The electrodes 413 and 418 may have a layered structure of any of the above-described materials.

The gate insulating film 414 may have a structure similar to that of the gate insulating film 404.

The gate electrode 417 may have a structure similar to that of the electrodes 413 and 418.

The capacitor 461 includes the electrode 413, the gate insulating film 414 covering the electrode 413, and a capacitor wiring 419 formed from the same layer as the gate electrode. In other words, the gate insulating film also serves as an insulating film for a capacitor in this embodiment. Accordingly, there is no need to additionally form an insulating film for a capacitor, and the process can be simplified. Needless to say, the present invention is not construed as being limited to the above, and an insulating film for a capacitor may be formed in addition to the gate insulating film.

Here, capacitance of the capacitor 461 is determined by the area of the gate insulating film 414 sandwiched between the capacitor wiring 419 and the electrode 413 and the thickness of the gate insulating film 414. If the gate insulating film 414 is too thin, charge of the capacitor 461 may leak out. On the other hand, if the gate insulating film 414 is too thick, it is feared that electrical characteristics of the transistor 450 are degraded and reliability thereof is reduced. Thus, the thickness of the gate insulating film 414 is set to be more than or equal to 5 nm and less than or equal to 100 nm, preferably more than or equal to 10 nm and less than or equal to 30 nm. As the thickness of the gate insulating film 414 is smaller, the capacitance per unit area can be increased and therefore the area of the memory cell can be reduced. Also by using a high relative-permittivity (high-k) material for the gate insulating film 414, the area of the memory cell can be reduced.

The sub memory cell 410 includes an interlayer film 416 that covers the transistor 451 and the capacitor 461.

It is preferable that a surface of the interlayer film 416 be planarized by CMP or the like because the sub memory cells can be easily formed to overlap with each other.

The sub memory cell 420 and the sub memory cell 430 may each have a structure similar to that of the sub memory cell 410.

Here, the capacitance of a capacitor 462 in the sub memory cell 420 and the capacitance of a capacitor 463 in the sub memory cell 430 may be set to be twice and quadruple the capacitance of the capacitor 461 respectively, by arranging the area of the capacitor 462 and the area of the capacitor 463 to be twice and quadruple the area of the capacitor 461, for example. Note that the area of the capacitor 462 and the area of the capacitor 463 can be changed by changing the area of a capacitor wiring 429 and the area of a capacitor wiring 439, respectively. Alternatively, the thickness of the gate insulating film in the sub memory cell 420 and the thickness of the gate insulating film in the sub memory cell 430 may be set to be half and quarter the thickness of the gate insulating film 414. Further alternatively, the capacitance may be controlled by appropriately combining the relative permittivity and the thickness of the gate insulating film. Needless to say, the same can apply to the structure of additionally providing an insulating film for a capacitor.

In this embodiment, three layers of sub memory cells overlap with each other; however, the present invention is not limited to the three layers and four or more layers of sub memory cells may be provided to overlap with each other.

With this structure, the area of the memory cell can be reduced. Therefore, by using a plurality of memory cells described in this embodiment, a memory module whose storage capacity per unit area is large can be manufactured.

Note that this embodiment can be combined with any of the other embodiments as appropriate.

Embodiment 5

In this embodiment, an example different from that of Embodiment 4 of a manufacturing method of memory cells which are semiconductor memory devices described in Embodiments 1 to 3 will be described.

In this embodiment, a structure in which sub memory cells are manufactured in the same layer to form one memory cell will be described.

By manufacturing sub memory cells in the same layer, further reduction in the area of the memory module can be achieved.

Figure 7:
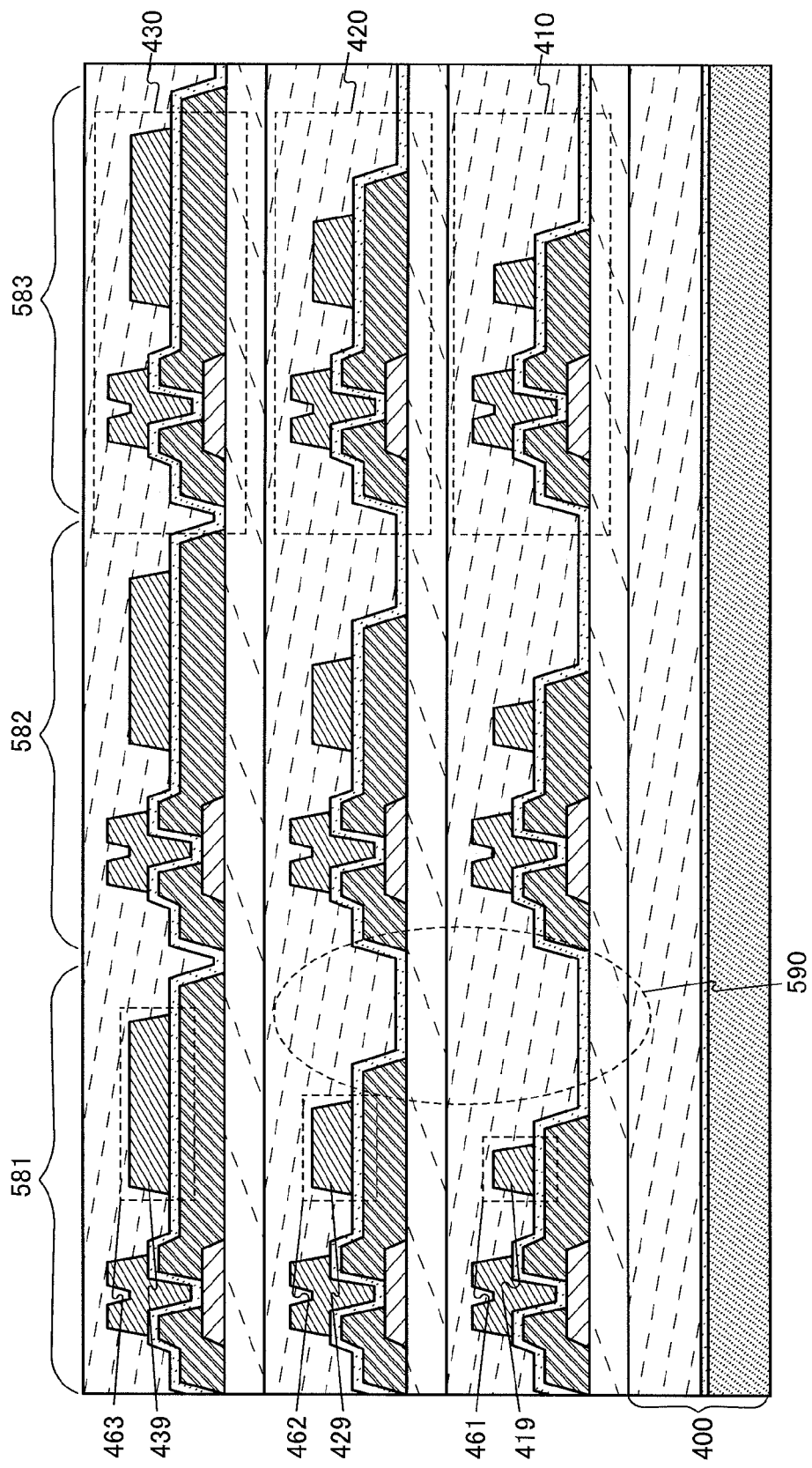
FIG. 7 illustrates a cross-sectional structure of a memory module of a semiconductor memory device.

FIG. 7 is an example of a cross-sectional view illustrating a memory module that is manufactured by arranging three columns of memory cells manufactured in Embodiment 4 (a memory cell 581, a memory cell 582, and a memory cell 583).

The structures of the sub memory cell 410, the sub memory cell 420, and the sub memory cell 430 have been described in Embodiment 4 and are omitted here.

As indicated by a region 590, this structure produces a space that is not used between the memory cells. This is because the area of the capacitor wirings is adjusted in order that the capacitance (C1) of the capacitor 461, the capacitance (C2) of the capacitor 462, and the capacitance (C3) of the capacitor 463 have the following relation: C1:C2:C3=1:2:4. In other words, the space that is not used is produced between the memory cells because the area of the capacitor wiring 419, the area of the capacitor wiring 429, and the area of the capacitor wiring 439 are different from one another.

Figure 8:
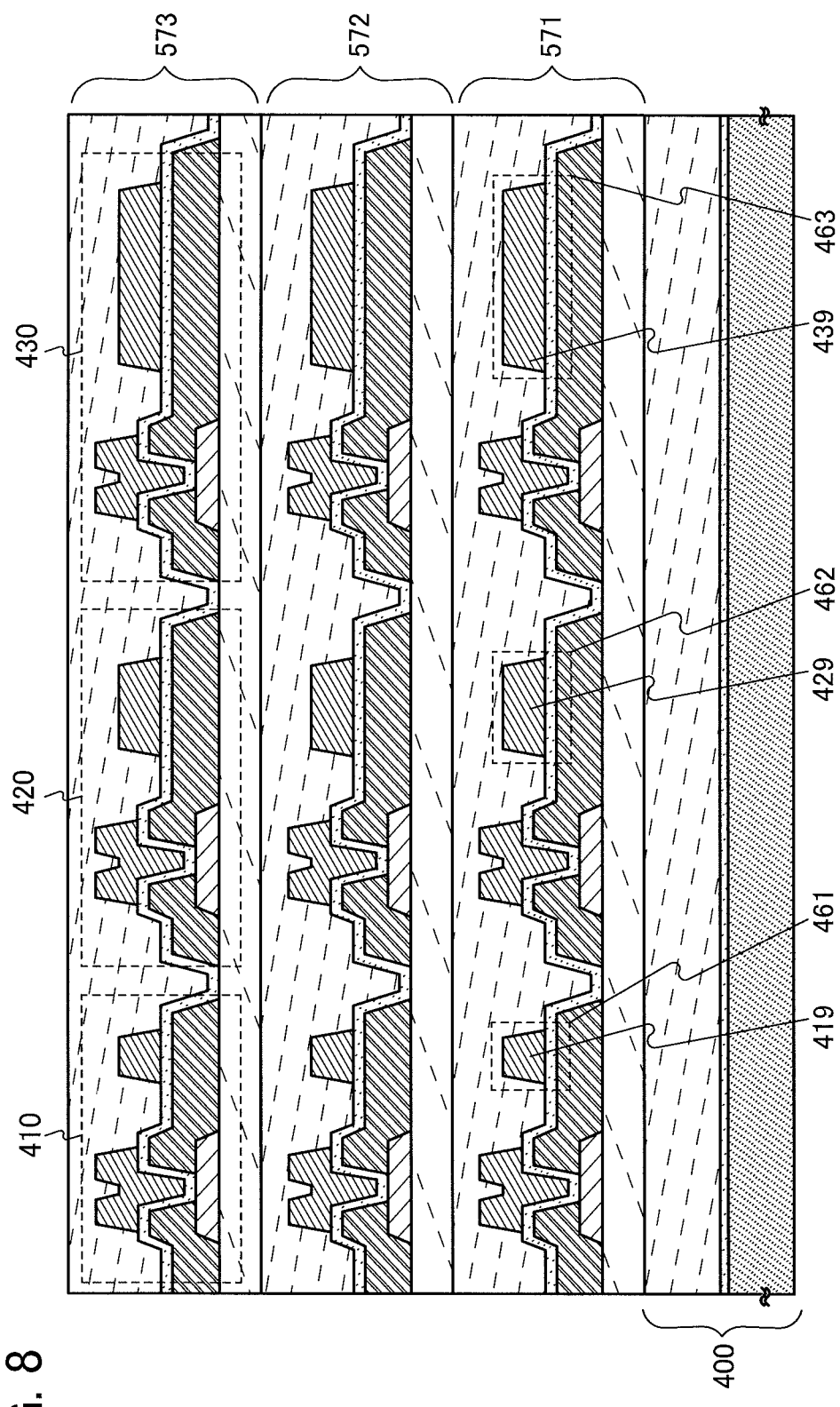
FIG. 8 illustrates a cross-sectional structure of a memory module of a semiconductor memory device.

FIG. 8 is an example of a cross-sectional view illustrating a memory module manufactured by stacking three layers of memory cells (a memory cell 571, a memory cell 572, and a memory cell 573) which are each manufactured to include the sub memory cell 410, the sub memory cell 420, and the sub memory cell 430 in the same layer.

With the structure of the memory module illustrated in FIG. 8, a space like the region 590 illustrated in FIG. 7 can be reduced. Thus, a memory module which achieves further reduction in the area can be manufactured.

In this embodiment, an example of the memory module including three memory cells has been described particularly; however, the present invention is not limited thereto and the memory module may include four or more memory cells. Needless to say, a structure in which the memory module includes two memory cells may also be employed.

Further, a plurality of memory modules as described in this embodiment may be arranged in the same layer, for example. That is, a structure including a plurality of $2^n$-level memory cells can be employed.

With this structure, the area of the memory module can be reduced. Therefore, a memory module whose storage capacity per unit area is large can be manufactured.

Note that this embodiment can be combined with any of the other embodiments as appropriate.

Embodiment 6

In this embodiment, an example of providing one capacitor in the region 400 will be described.

When a capacitor is provided in the region 400, the size of the largest sub memory cell can be reduced, which leads to reduction in the area of the whole memory cell.

In the case where a depression or a projection is provided for a silicon wafer and a capacitor is formed over the depression or the projection, capacitance per unit area of the silicon wafer can be increased. This structure is called a trench structure.

Figure 9:
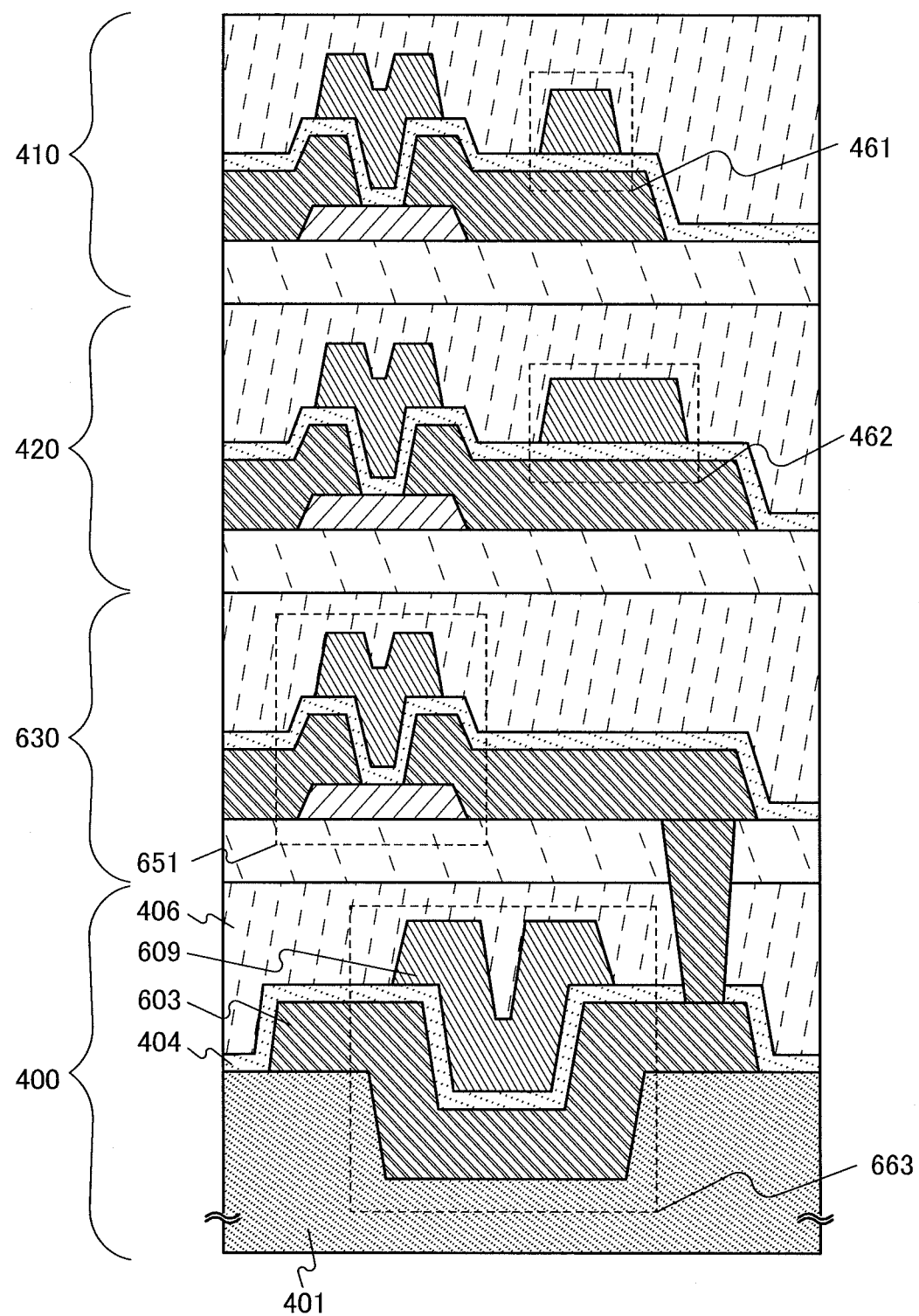
FIG. 9 illustrates a cross-sectional structure of a memory cell of a semiconductor memory device.

FIG. 9 is a cross-sectional view illustrating a memory module in which a depression is provided for the silicon wafer 401 and a capacitor 663 is formed to overlap with the depression. Note that the capacitor 663 functions as a capacitor of a sub memory cell 630.

The sub memory cell 630 includes a transistor 651. The transistor 651 has a structure similar to that of the transistor 451 described in Embodiment 4.

In the region 400, the depression is provided for the silicon wafer 401 so that the capacitor 663 can have a necessary capacitance, in consideration of the capacitance of the capacitor 461 and the capacitance of the capacitor 462. Note that the shape of the depression is not limited to the shape illustrated in FIG. 9. For example, a structure in which a depression is provided in another depression, a structure in which a projection is provided in a depression, or a combination of these structures may be employed.

The gate insulating film 404 functions as a capacitor layer of the capacitor 663. Although an example in which the gate insulating film 404 is used as a capacitor layer is described, a structure in which an insulating film for a capacitor is additionally provided may also be employed.

Since the capacitor 663 is a capacitor of the sub memory cell 630, the capacitor 663 is connected to a source or drain electrode of the transistor 651 through a contact hole.

An electrode 603 may be formed from the same layer as an electrode of a transistor that is used in a sense amplifier or the like in the region 400. The same can apply to a capacitor wiring 609.

The electrode 603 and the capacitor wiring 609 may have a structure similar to that of the electrodes 413 and 418 described in Embodiment 4.

By formation of the depression in the silicon wafer 401, the surface area of the electrode 603 is increased, and the capacitance of the capacitor 663 using the electrode 603 and the capacitor wiring 609 can be increased. Therefore, further reduction in the area of the memory cell with the same storage capacity maintained can be achieved.

Figure 10:
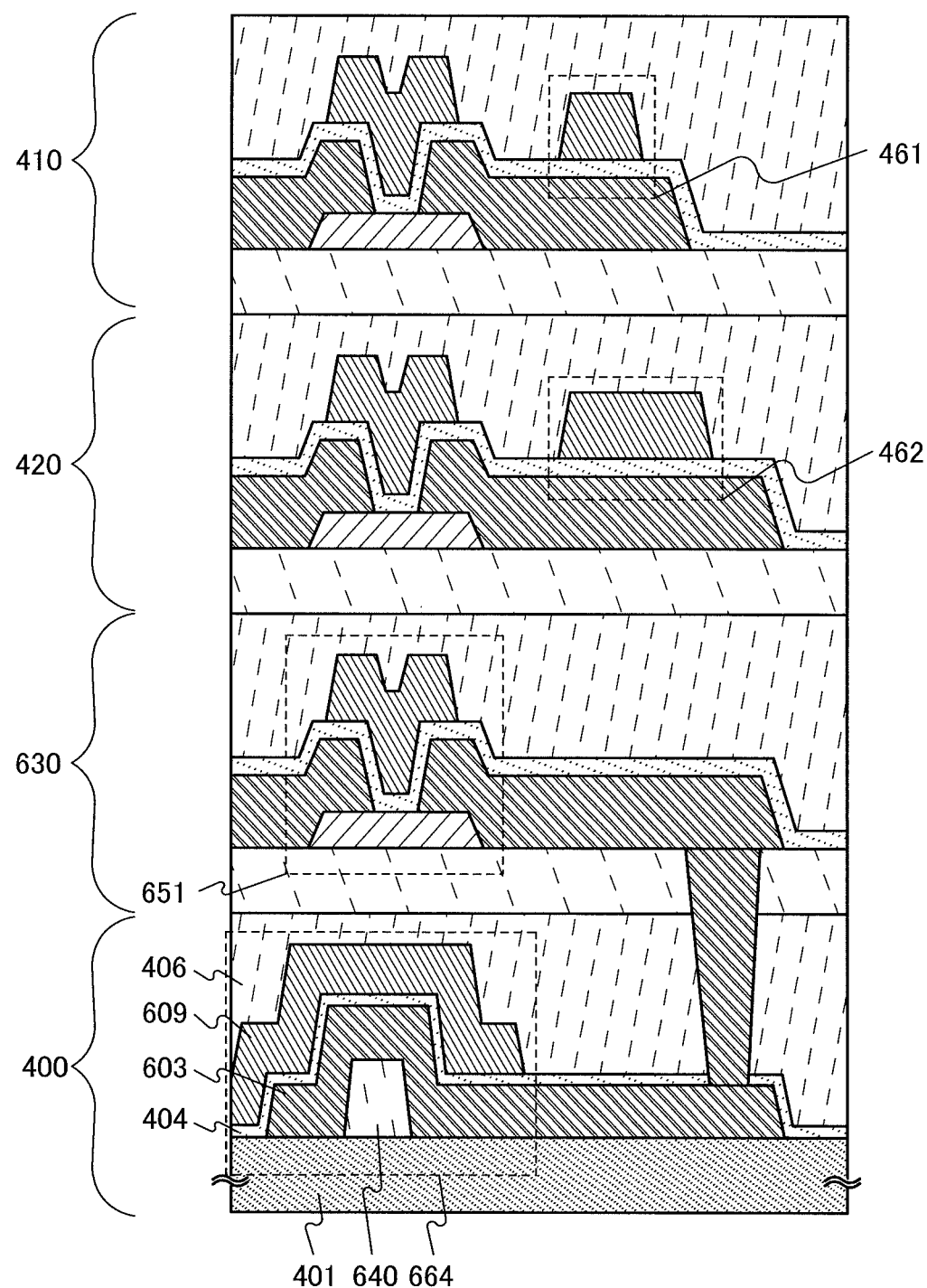
FIG. 10 illustrates a cross-sectional structure of a memory cell of a semiconductor memory device.
Figure 11A:
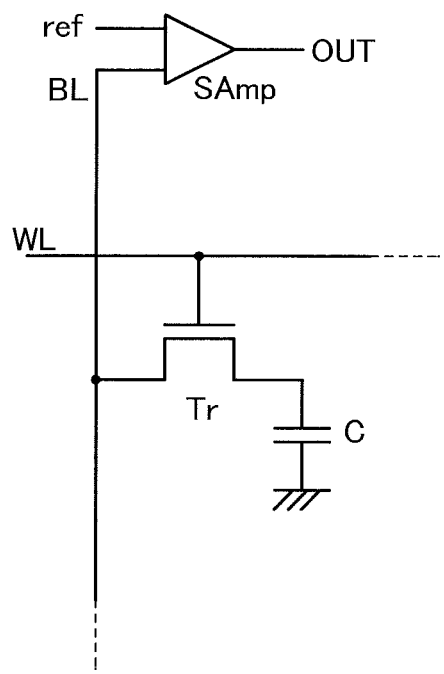
FIGS. 11A to 11C show a conventional semiconductor memory device.
Figure 11B:
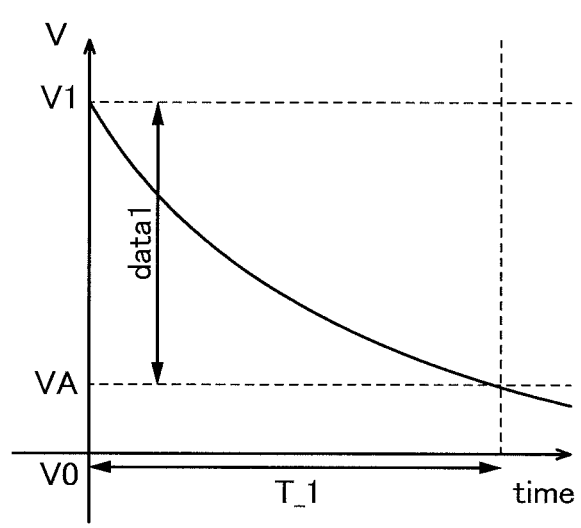
Figure 11C:
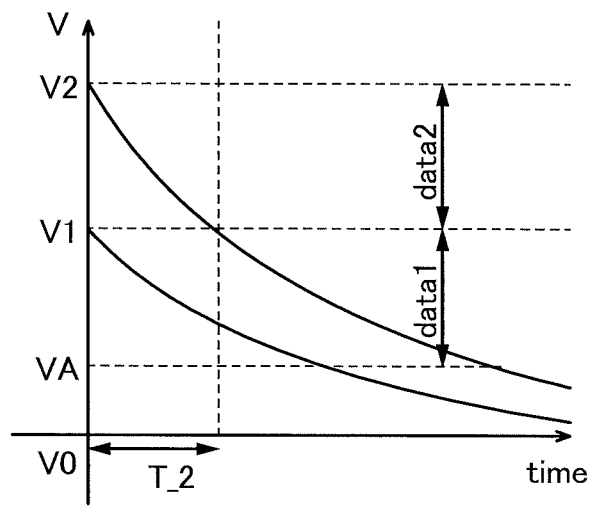

FIG. 10 is a cross-sectional view of a memory module in which a projection 640 is formed over the silicon wafer 401 and a capacitor 664 is formed. Note that the capacitor 664 functions as a capacitor of the sub memory cell 630.

In the region 400, the projection 640 is provided for the silicon wafer 401 so that the capacitor 664 can have a necessary capacitance, in consideration of the capacitance of the capacitor 461 and the capacitance of the capacitor 462. Note that the shape of the projection is not limited to the shape illustrated in FIG. 10. For example, a structure in which a depression is provided in a projection, a structure in which a projection is provided in another projection, or a combination of these structures may be employed.

By provision of the projection 640 for the silicon wafer 401, the surface area of the electrode 603 is increased, and the capacitance of the capacitor 664 using the electrode 306 and the capacitor wiring 609 can be increased. Therefore, further reduction in the area of the memory cell with the same storage capacity maintained can be achieved.

Although an example in which the gate insulating film 404 is used as a capacitor layer is described, a structure in which an insulating film for a capacitor is additionally provided may also be employed.

Although not shown, in the case of using a silicon carbide substrate or a gallium nitride substrate instead of the silicon wafer 401, a structure in which the transistor 651 is provided in the region 400 may be employed. Since silicon carbide and gallium nitride each have a wide bandgap, small off-state current can be achieved, whereby the potential of a capacitor can be sufficiently held. With the structure in which the transistor is provided in the region 400, a sub memory cell can also be formed in the region 400; accordingly, a memory cell having a large storage capacity can be manufactured, which is preferable.

Note that this embodiment can be combined with any of the other embodiments as appropriate.

Embodiment 7

In this embodiment, an example of operation of a semiconductor memory device using an embodiment of the present invention will be described.

FIGS. 2A and 2B and FIGS. 3A and 3B illustrate a semiconductor memory device including two 3-bit memory cells (CL_1, CL_2). The memory cell CL_1 includes three sub memory cells (SCL_1_1, SCL_1_2, SCL_1_3) having a structure similar to that of Embodiment 1. The memory cell CL_2 includes three sub memory cells (SCL_2_1, SCL_2_2, SCL_2_3) having a structure similar to that of Embodiment 1. Gates of transistors of the sub memory cells SCL_1_1 and SCL_2_1 are connected to a word line WL_1, gates of transistors of the sub memory cells SCL_1_2 and SCL_2_2 are connected to a word line WL_2, and gates of transistors of the sub memory cells SCL_1_3 and SCL_2_3 are connected to a word line WL_3. The sub memory cells SCL_1_1, SCL_1_2, and SCL_1_3 are connected to a bit line BL_1, and the sub memory cells SCL_2_1, SCL_2_2, and SCL_2_3 are connected to a bit line BL_2. Although not shown, the bit lines BL_1 and BL_2 are connected to sense amplifiers.

Here, operation in which data 5 and data 3 are written to or read from the memory cells CL_1 and CL_2 will be described.

First, the word line WL_1 is set at VH, the word lines WL_2 and WL_3 are set at GND, and the bit lines BL_1 and BL_2 are set at VDD. Thus, data 1 is written to the sub memory cells SCL_1_1 and SCL_2_1 (see FIG. 2A).

Next, the word line WL_2 is set at VH, the word lines WL_1 and WL_3 are set at GND, the bit line BL_1 is set at GND, and the bit line BL_2 is set at VDD. Thus, data 0 and data 1 are written to the sub memory cells SCL_1_2 and SCL_2_2, respectively (see FIG. 2B).

Then, the word line WL_3 is set at VH, the word lines WL_1 and WL_2 are set at GND, the bit line BL_1 is set at VDD, and the bit line BL_2 is set at GND. Thus, data 1 and data 0 are written to the sub memory cells SCL_1_3 and SCL_2_3, respectively (see FIG. 3A).

In the above-described manner, data CL_1 (data 5) and data CL_2 (data 3) can be written to the memory cells CL_1 and CL_2, respectively. Note that although the method of writing data per row has been described here, the present invention is not limited thereto and a method of writing data per sub memory cell may also be employed.

For reading, first of all, the bit lines BL_1 and BL_2 are set at appropriate potentials.

Figure 3A:
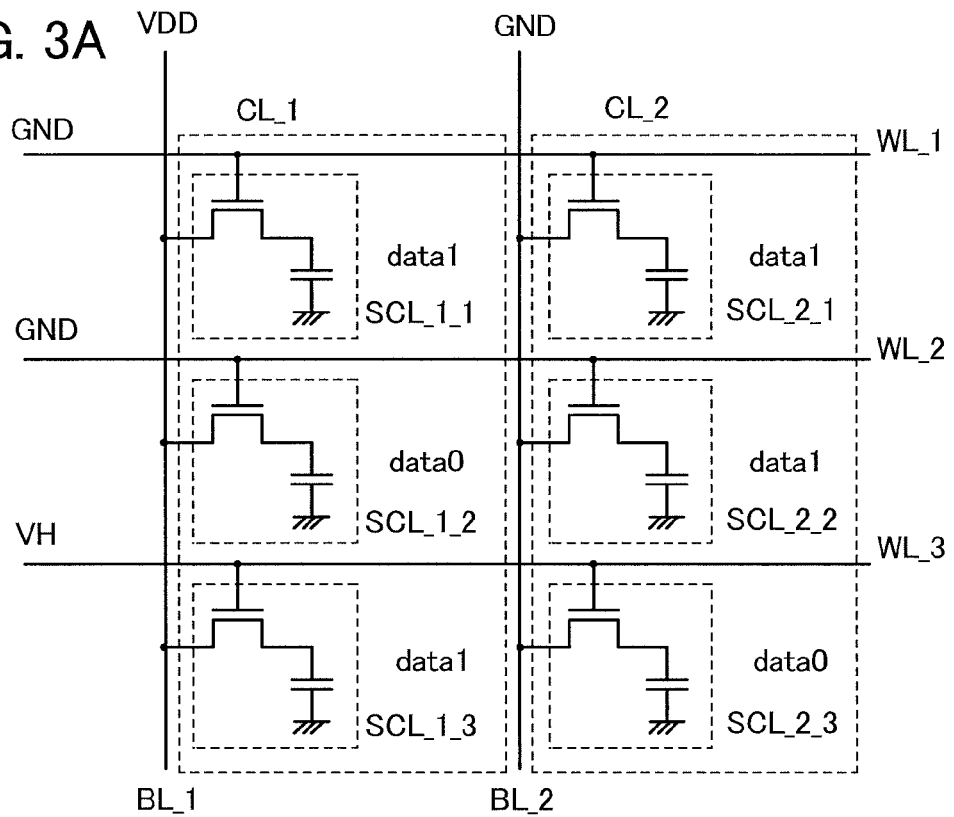
FIGS. 3A and 3B are circuit diagrams illustrating writing and reading of a semiconductor memory device.
Figure 3B:
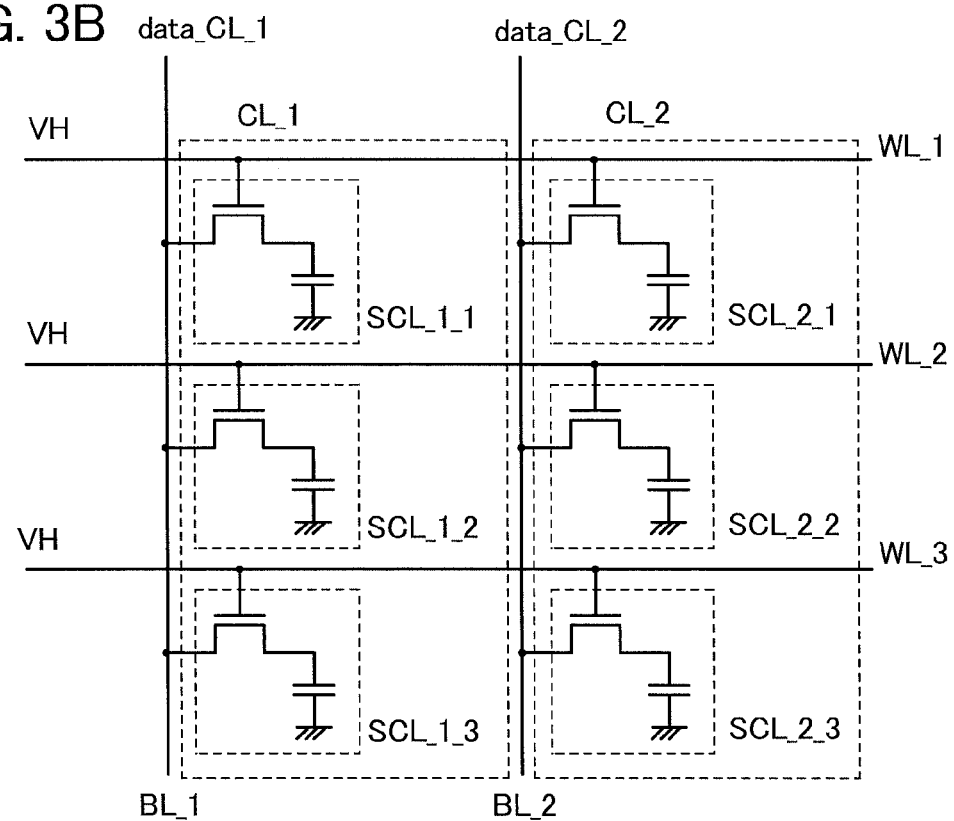

Next, the word lines WL_1, WL_2, and WL_3 are set at VH (see FIG. 3B). This makes the potentials of the bit lines BL_1 and BL_2 change to data CL_1 and data CL_2, respectively in accordance with the written data. These potentials are read by sense amplifiers, so that two pieces of 3-bit data can be output. Note that although the method for reading data per row has been described here, the present invention is not limited thereto and a method for reading data per sub memory cell may also be employed.

Embodiment 8

In this embodiment, an oxide including crystals with c-axis alignment (also referred to as C-Axis Aligned Crystal (CAAC)), which have a triangular or hexagonal atomic arrangement when seen from the direction of an a-b plane, a surface, or an interface, and in which metal atoms are arranged in a layered manner, or metal atoms and oxygen atoms are arranged in a layered manner along the c-axis, and the direction of the a-axis or the b-axis is varied in the a-b plane (the crystal rotates around the c-axis), will be described.

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The oxide including CAAC is not a single crystal, but this does not mean that the oxide including CAAC is composed of only an amorphous component. Although the CAAC includes a crystallized portion (crystalline portion), a boundary between one crystalline portion and another crystalline portion is not clearly determined in some cases.

In the case where oxygen is included in the oxide including CAAC, nitrogen may be substituted for part of oxygen included in the oxide including CAAC. The c-axes of individual crystalline portions included in the oxide including CAAC may be aligned in a certain direction (e.g., a direction perpendicular to a surface of a substrate over which the oxide including CAAC is formed or a surface of the oxide including CAAC). Alternatively, the normals of the a-b planes of the individual crystalline portions included in the oxide including CAAC may be aligned in a certain direction (e.g., a direction perpendicular to a surface of a substrate over which the oxide including CAAC is formed or a surface of the oxide including CAAC).

The oxide including CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 12A to 12E, FIGS. 13A to 13C, and FIGS. 14A to 14C. In FIGS. 12A to 12E, FIGS. 13A to 13C, and FIGS. 14A to 14C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 12A to 12E, 0 surrounded by a circle represents tetracoordinate O and O surrounded by a double circle represents tricoordinate O.

Figure 12A:
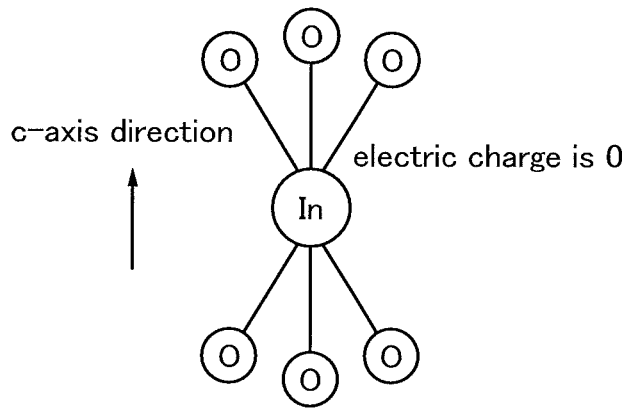
FIGS. 12A to 12E are views illustrating crystal structures of oxide semiconductors.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 12A is actually an octahedral structure, but is illustrated as a planar structure for simplicity. Note that three tetracoordinate O atoms exist in each of an upper half and a lower half in FIG. 12A. In the small group illustrated in FIG. 12A, electric charge is 0.

Figure 12D:
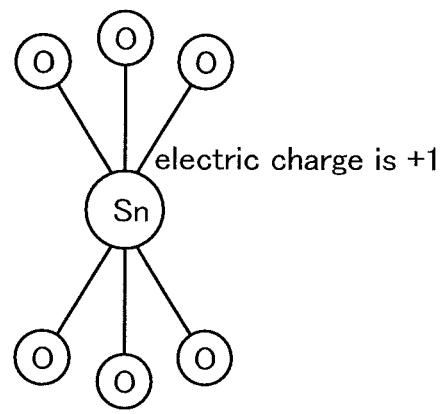
Figure 12B:
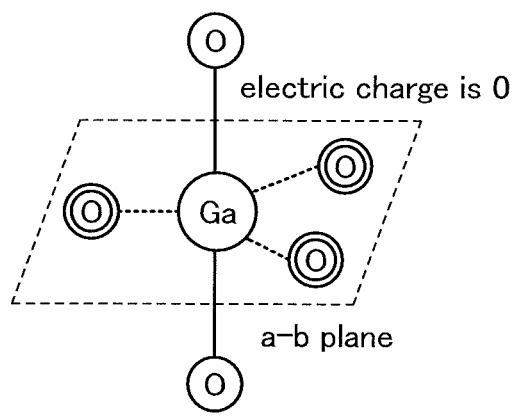

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 12B. An In atom can also have the structure illustrated in FIG. 12B because an In atom can have five ligands. In the small group illustrated in FIG. 12B, electric charge is 0.

Figure 12E:
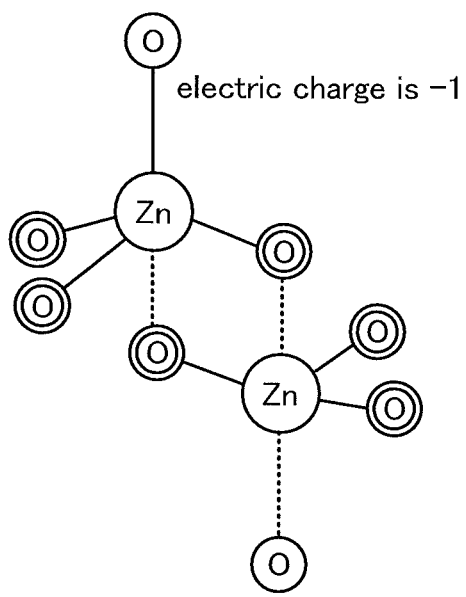
Figure 12C:
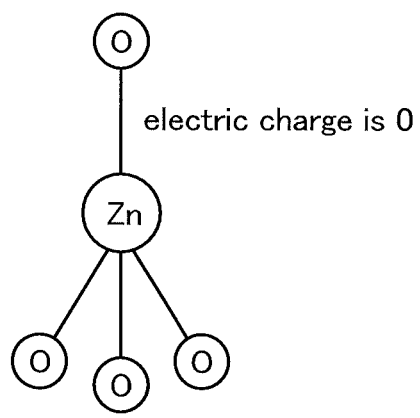

FIG. 12C illustrates a structure including one tetracoordinate Zn atom and four tetracoordinate O atoms proximate to the Zn atom. In FIG. 12C, one tetracoordinate O atom exists in an upper half and three tetracoordinate O atoms exist in a lower half.

Alternatively, three tetracoordinate O atoms may exist in the upper half and one tetracoordinate O atom may exist in the lower half in FIG. 12C. In the small group illustrated in FIG. 12C, electric charge is 0.

FIG. 12D illustrates a structure including one hexacoordinate Sn atom and six tetracoordinate O atoms proximate to the Sn atom. In FIG. 12D, three tetracoordinate O atoms exist in each of an upper half and a lower half. In, the small group illustrated in FIG. 12D, electric charge is +1.

FIG. 12E illustrates a small group including two Zn atoms. In FIG. 12E, one tetracoordinate O atom exists in each of an upper half and a lower half. In the small group illustrated in FIG. 12E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 12A each have three proximate In atoms in the downward direction, and the three O atoms in the lower half each have three proximate In atoms in the upward direction. The one O atom in the upper half with respect to the pentacoordinate Ga atom in FIG. 12B has one proximate Ga atom in the downward direction, and the one O atom in the lower half has one proximate Ga atom in the upward direction. The one O atom in the upper half with respect to the tetracoordinate Zn atom in FIG. 12C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 13A:
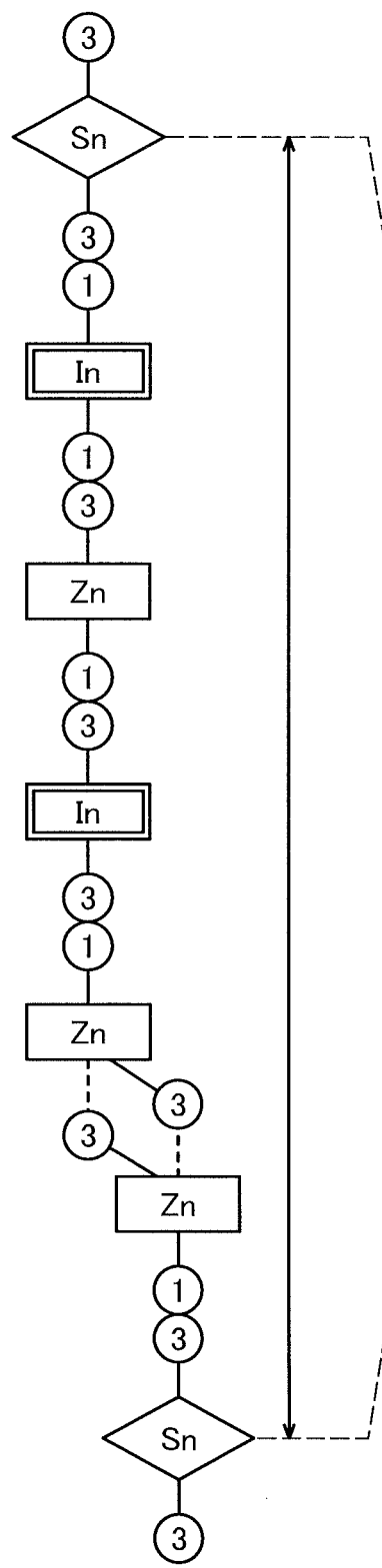
FIGS. 13A to 13C are views illustrating a crystal structure of an oxide semiconductor.
Figure 13B:
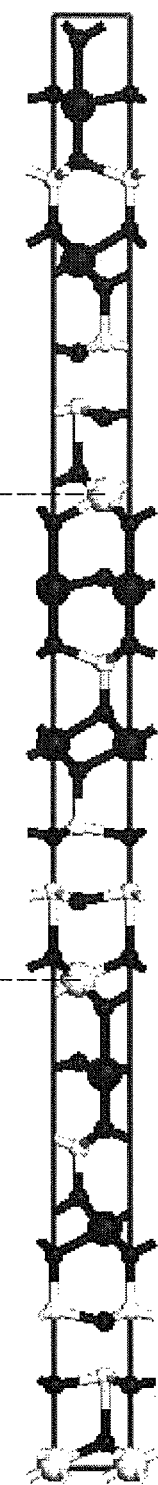
Figure 13C:
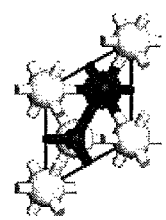

FIG. 13A illustrates a model of a medium group included in a layered structure of an In—Sn—Zn—O-based material. FIG. 13B illustrates a large group including three medium groups. Note that FIG. 13C illustrates an atomic arrangement in the case where the layered structure in FIG. 13B is observed from the c-axis direction.

In FIG. 13A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 13A, one tetracoordinate O atom existing in each of an upper half and a lower half with respect to an In atom is denoted by circled 1. FIG. 13A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 13A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 12E can be given. For example, with one small group including two Zn atoms, electric charge of one small group including a Sn atom can be cancelled, so that the total electric charge of the layered structure can be 0.

When the large group illustrated in FIG. 13B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following materials: a four-component metal oxide such as an In—Sn—Ga—Zn—O-based material; a three-component metal oxide such as an In—Ga—Zn—O-based material (also referred to as IGZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; and the like.

Figures 14A, 14B, 14C:
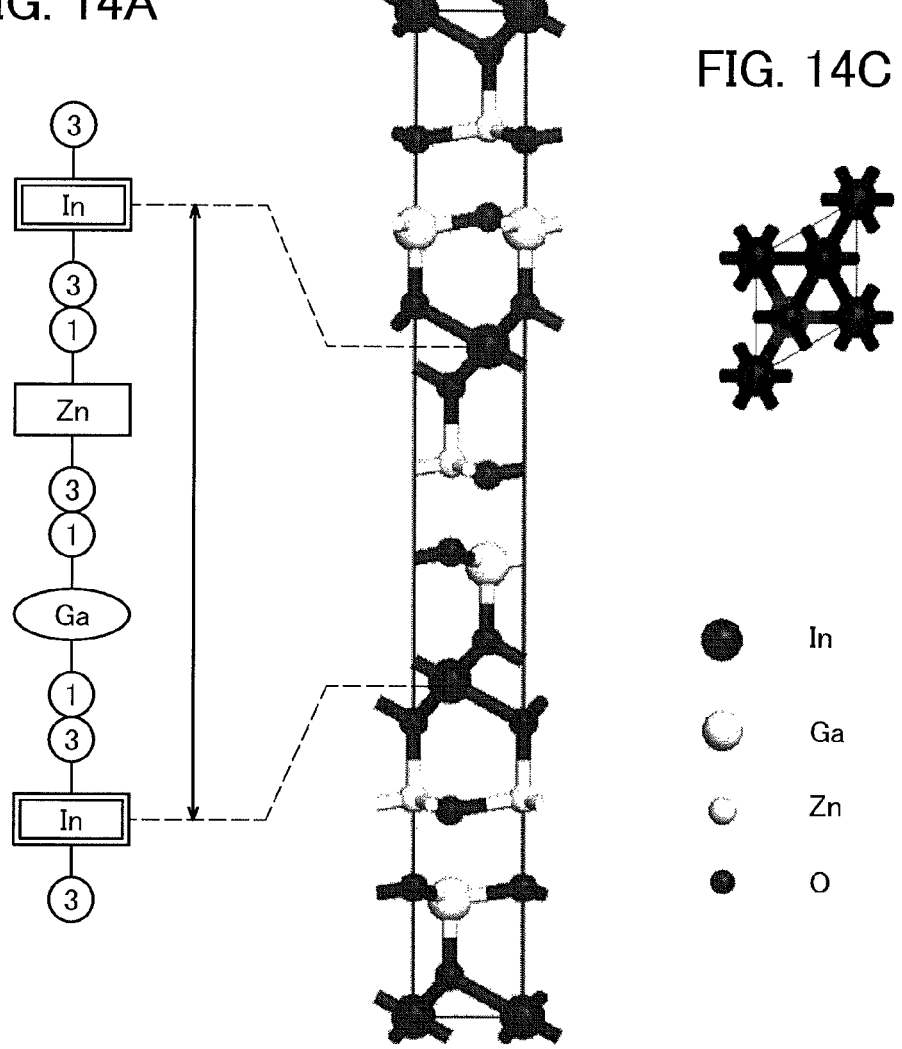
FIGS. 14A to 14C are views illustrating a crystal structure of an oxide semiconductor.

As an example, FIG. 14A illustrates a model of a medium group included in a layered structure of an In—Ga—Zn—O-based material.

In the medium group included in the layered structure of the In—Ga—Zn—O-based material in FIG. 14A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate atoms in each of an upper half and a lower half through one tetracoordinate O atom in a lower half with respect to the Ga atom. A plurality of such medium groups are bonded, so that a large group is formed.

FIG. 14B illustrates a large group including three medium groups. Note that FIG. 14C illustrates an atomic arrangement in the case where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 14A but also a medium group in which the arrangement of the In atom, the Ga atom, and the Zn atom is different from that in FIG. 14A.

Embodiment 9

In this embodiment, the field-effect mobility of a transistor that uses an oxide semiconductor film will be described.

The actually measured field-effect mobility of an insulated gate transistor can be lower than its original field-effect mobility because of a variety of reasons; this phenomenon occurs not only in the case of using an oxide semiconductor film. One of the reasons that reduce the field-effect mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original field-effect mobility and the measured field-effect mobility are $\mu_0$ and $\mu$, respectively, and a potential barrier (such as a grain boundary) exists in a semiconductor, the measured field-effect mobility can be expressed as the following formula.

$$\mu = \mu_0 \exp\left(-\frac{E}{kT}\right) \quad \text{[FORMULA 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \quad \text{[FORMULA 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W\mu V_g V_d C_{ox}}{L}\exp\left(-\frac{E}{kT}\right) \quad \text{[FORMULA 4]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W\mu V_d C_{ox}}{L}\right) - \frac{E}{kT} \quad \text{[FORMULA 5]}$$
$$= \ln\left(\frac{W\mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor film in which the ratio of In, Sn, and Zn is 1:1:1 (in an atomic ratio) is approximately $1\times10^{12}/cm^2$.

On the basis of the defect density obtained in this manner, or the like, $\mu_0$ can be calculated to be 120 cm²/Vs from Formula 2 and Formula 3. The measured field-effect mobility of a transistor that uses an In—Sn—Zn—O film including a defect is approximately 35 cm²/Vs. However, assuming that no defect exists inside the semiconductor and at the interface between the semiconductor and a gate insulating film, the field-effect mobility $\mu_0$ of the transistor that uses the oxide semiconductor film is expected to be 120 cm²/Vs.

Note that even when no defect exists inside a semiconductor, scattering at an interface between the semiconductor and a gate insulating film affects the transport property of the transistor. In other words, the field-effect mobility $\mu_1 1_1$ at a position that is distance x away from the interface between the semiconductor and the gate insulating film can be expressed as the following formula.

$$\frac{1}{\mu_1} = \frac{1}{\mu_0} + \frac{D}{B}\exp\left(-\frac{x}{G}\right) \quad \text{[FORMULA 6]}$$

Here, D represents the electric field in the gate direction, and B and G are constants. B and G can be obtained from actual measurement results; according to the above measurement results, B is $4.75\times10^7$ cm/s and G is 10 nm (the depth to which the influence of interface scattering reaches). When D is increased (i.e., when the gate voltage is increased), the second term of Formula 6 is increased and accordingly the field-effect mobility $\mu_1$ is decreased.

Figure 15:
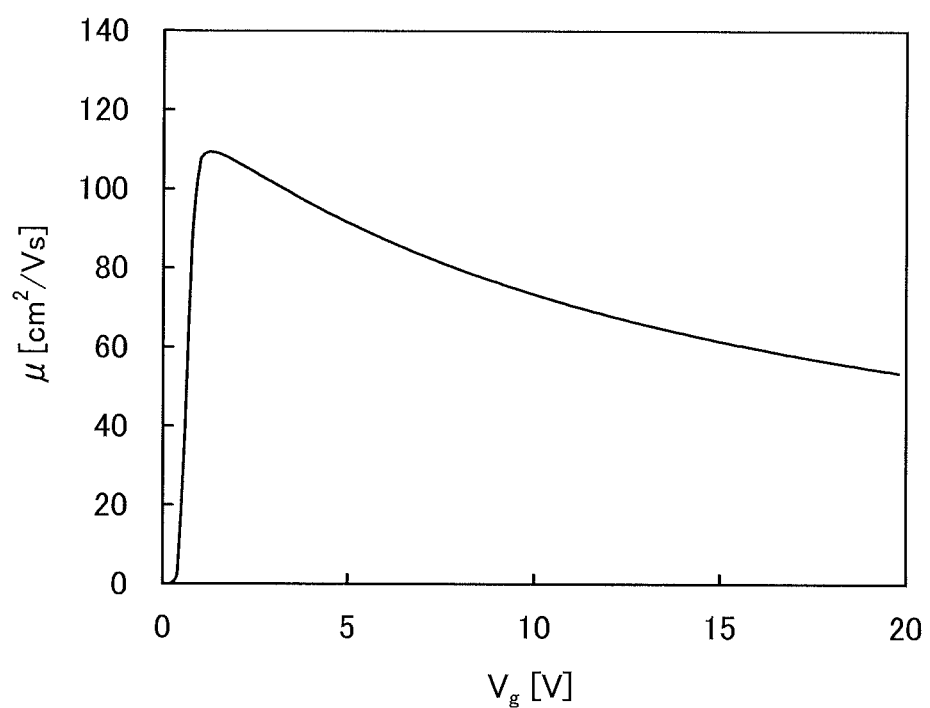
FIG. 15 shows the gate voltage dependence of field-effect mobility obtained by calculation.

Calculation results of the field-effect mobility $\mu_2$ of a transistor whose channel includes an ideal oxide semiconductor film without a defect inside the semiconductor are shown in FIG. 15. For the calculation, device simulation software Sentaurus Device manufactured by Synopsys, Inc. was used, and the bandgap, the electron affinity, the relative permittivity, and the thickness of the oxide semiconductor film were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 15, the field-effect mobility has a peak of more than 100 cm²/Vs at a gate voltage that is a little over 1 V and is decreased as the gate voltage becomes higher because the influence of interface scattering is increased. Note that in order to reduce the influence of interface scattering, it is preferable that a surface of the semiconductor layer be flat at the atomic level (atomic layer flatness).

Calculation results of characteristics of minute transistors which are manufactured using such an ideal oxide semiconductor film are shown in FIGS. 16A to 16C, FIGS. 17A to 17C, and FIGS. 18A to 18C. FIGS. 19A and 19B illustrate cross-sectional structures of the transistors used for the calculation. The transistors illustrated in FIGS. 19A and 19B each include a semiconductor region 1103a and a semiconductor region 1103c which have n⁺-type conductivity in an oxide semiconductor film. The resistivities of the semiconductor region 1103a and the semiconductor region 1103c are $2\times10^{-3}$ Ωcm.

The transistor illustrated in FIG. 19A is formed over a base insulating layer 1101 and an embedded insulator 1102 which is embedded in the base insulating layer 1101 and formed of aluminum oxide. The transistor includes the semiconductor region 1103a, the semiconductor region 1103c, an intrinsic semiconductor region 1103b serving as a channel formation region therebetween, and a gate 105. The width of the gate 1105 is 33 nm.

A gate insulating film 1104 is formed between the gate 1105 and the semiconductor region 1103b. In addition, a sidewall insulator 1106a and a sidewall insulator 1106b are formed on both side surfaces of the gate 1105, and an insulator 1107 is formed over the gate 1105 so as to prevent a short circuit between the gate 1105 and another wiring. The sidewall insulator has a width of 5 nm. A source 1108a and a drain 1108b are provided in contact with the semiconductor region 1103a and the semiconductor region 1103c, respectively. Note that the channel width of this transistor is 40 nm.

The transistor of FIG. 19B is the same as the transistor of FIG. 19A in that it is formed over the base insulating layer 1101 and the embedded insulator 1102 formed of aluminum oxide and that it includes the semiconductor region 1103a, the semiconductor region 1103c, the semiconductor region 1103b provided therebetween, the gate 1105 having a width of 33 nm, the gate insulating film 1104, the sidewall insulator 1106a, the sidewall insulator 1106b, the insulator 1107, the source 1108a, and the drain 1108b.

The transistor illustrated in FIG. 19A is different from the transistor illustrated in FIG. 19B in the conductivity type of semiconductor regions under the sidewall insulator 1106a and the sidewall insulator 1106b. In the transistor illustrated in FIG. 19A, the semiconductor regions under the sidewall insulator 1106a and the sidewall insulator 1106b are part of the semiconductor region 1103a having n⁺-type conductivity and part of the semiconductor region 1103c having n⁺-type conductivity, whereas in the transistor illustrated in FIG. 19B, the semiconductor regions under the sidewall insulator 1106a and the sidewall insulator 1106b are part of the intrinsic semiconductor region 1103b. In other words, in the semiconductor film of FIG. 19B, a region having a width of $L_{off}$ which overlaps with neither the semiconductor region 1103a (the semiconductor region 1103c) nor the gate 1105 is provided. This region is called an offset region, and the width $L_{off}$ is called an offset length. As is seen from the drawing, the offset length is equal to the width of the sidewall insulator 1106a (the sidewall insulator 1106b).

Figure 16A:
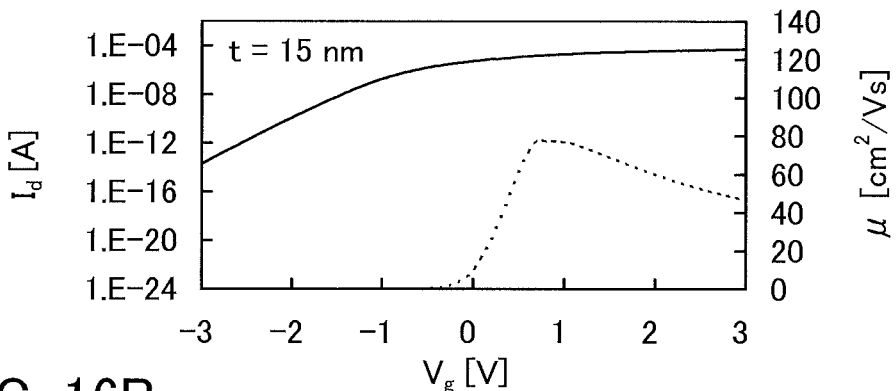
FIGS. 16A to 16C show the gate voltage dependence of drain current and field-effect mobility obtained by calculation.
Figure 16B:
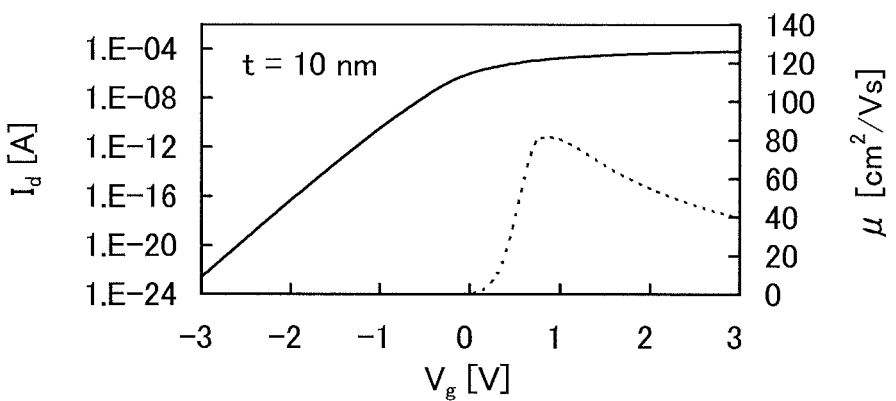
Figure 16C:
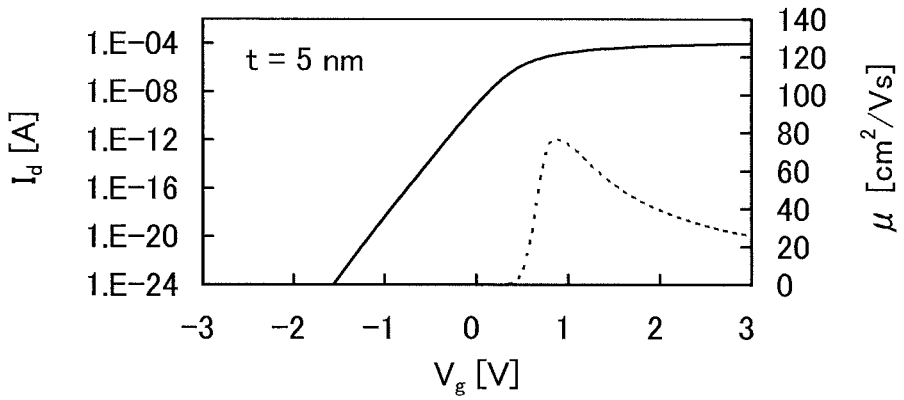

The other parameters used in calculation are as described above. For the calculation, device simulation software Sentaurus Device manufactured by Synopsys, Inc. was used. FIGS. 16A to 16C show the gate voltage ($V_g$: a potential difference between the gate and the source) dependence of the drain current ($I_d$, a solid line) and the field-effect mobility ($\mu$, a dotted line) of the transistor having the structure illustrated in FIG. 19A. The drain current $I_d$ is obtained by calculation under the assumption that the drain voltage (a potential difference between the drain and the source) is +1 V and the field-effect mobility $\mu$ is obtained by calculation under the assumption that the drain voltage is +0.1 V.

FIG. 16A shows the gate voltage dependence of the transistor in the case where the thickness of the gate insulating film is 15 nm, FIG. 16B shows that of the transistor in the case where the thickness of the gate insulating film is 10 nm, and FIG. 16C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the field-effect mobility $\mu$ and the drain current $I_d$ in an on state (on-state current). The graphs show that the drain current exceeds 10 μA, which is required in a memory element and the like, at a gate voltage of around 1 V.

Figure 17A:
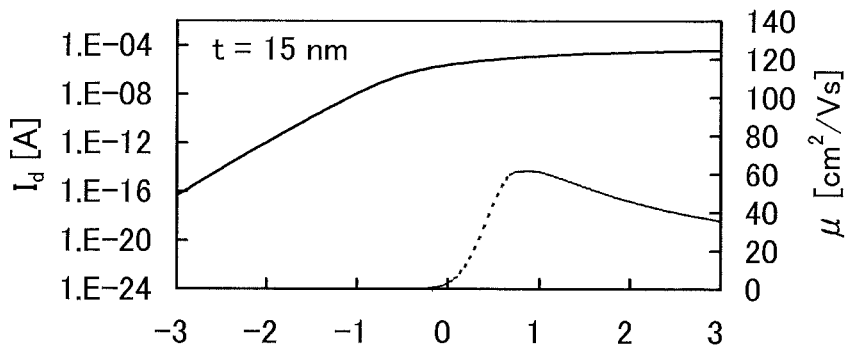
FIGS. 17A to 17C show the gate voltage dependence of drain current and field-effect mobility obtained by calculation.
Figure 17B:
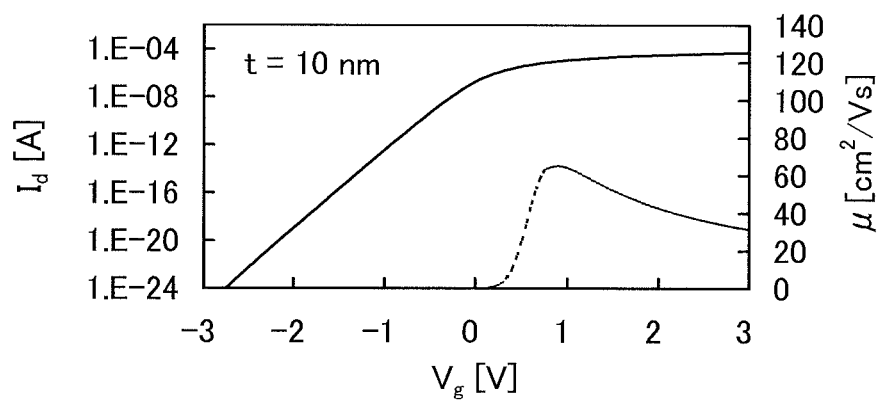
Figure 17C:
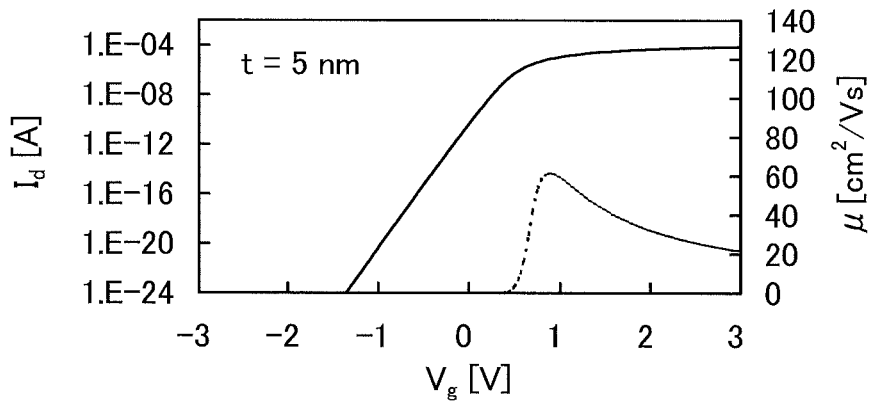

FIGS. 17A to 17C show the gate voltage $V_g$ dependence of the drain current $I_d$ (a solid line) and the field-effect mobility $\mu$ (a dotted line) of the transistor having the structure illustrated in FIG. 19B where the offset length $L_{off}$ is 5 nm. The drain current $I_d$ is obtained by calculation under the assumption that the drain voltage is +1 V and the field-effect mobility $\mu$ is obtained by calculation under the assumption that the drain voltage is +0.1 V. FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 nm.

Figure 18A:
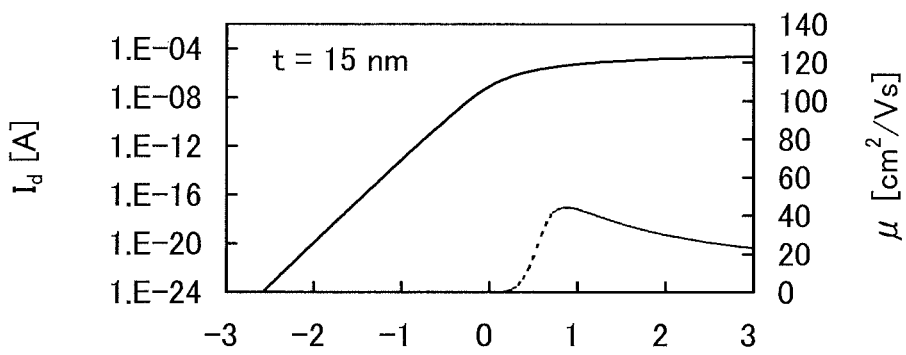
FIGS. 18A to 18C show the gate voltage dependence of drain current and field-effect mobility obtained by calculation.
Figure 18B:
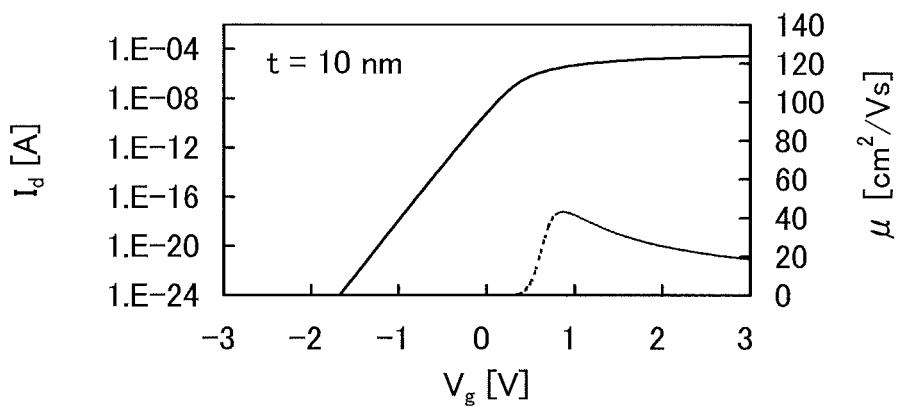
Figure 18C:
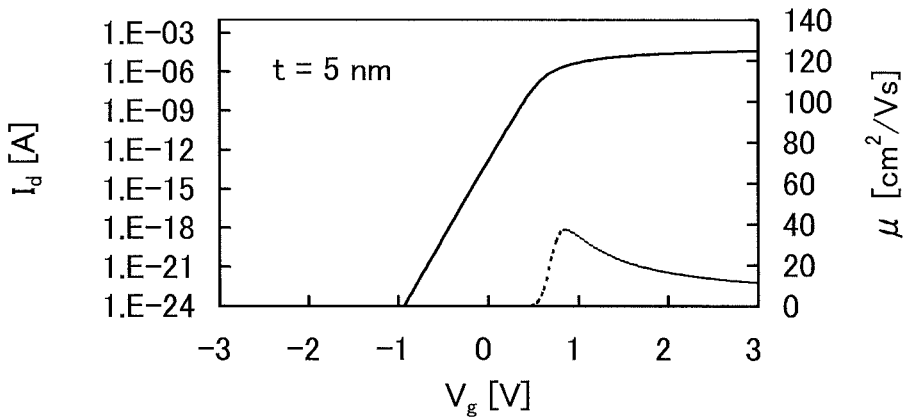
Figure 19A:
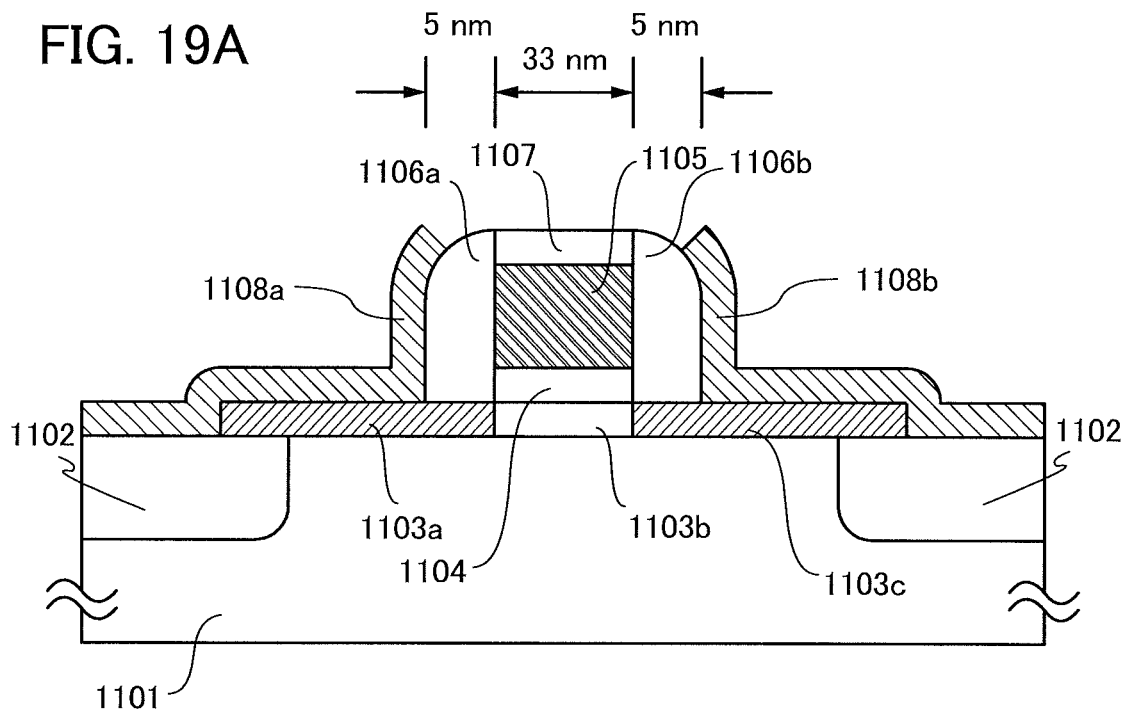
FIGS. 19A and 19B illustrate cross-sectional structures of transistors which are used in calculation.
Figure 19B:
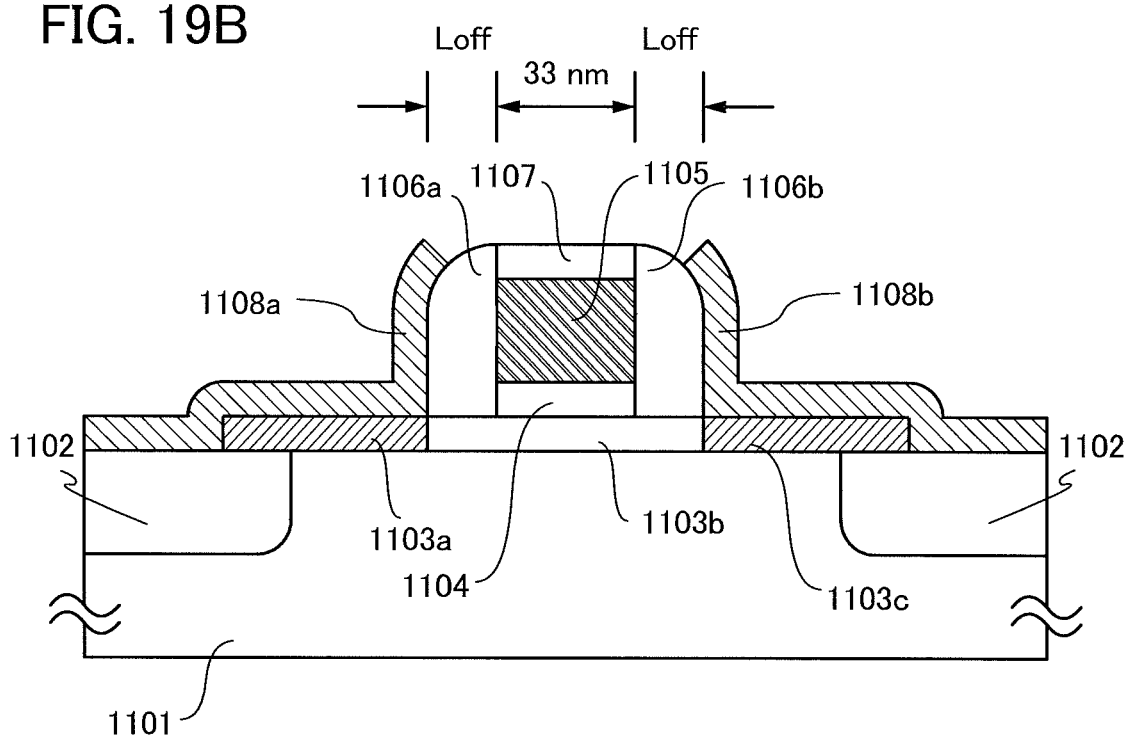

Further, FIGS. 18A to 18C show the gate voltage dependence of the drain current $I_d$ (a solid line) and the field-effect mobility $\mu$ (a dotted line) of the transistor having the structure illustrated in FIG. 19B where the offset length $L_{off}$ is 15 nm. The drain current $I_d$ is obtained by calculation under the assumption that the drain voltage is +1 V and the field-effect mobility $\mu$ is obtained by calculation under the assumption that the drain voltage is +0.1 V. FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm.

In either of the structures, as the gate insulating film is thinner, the off-state current is significantly decreased, whereas no noticeable change arises in the peak value of the field-effect mobility $\mu$ and the on-state current.

Note that the peak of the field-effect mobility $\mu$ is approximately 80 cm$^2$/Vs in FIGS. 16A to 16C, approximately 60 cm$^2$/Vs in FIGS. 17A to 17C, and approximately 40 cm$^2$/Vs in FIGS. 18A to 18C; thus, the peak of the field-effect mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Embodiment 10

In this embodiment, an example of a transistor that uses an oxide semiconductor film will be described.

A transistor in which a channel formation region is included in an oxide semiconductor film including In, Sn, and Zn can have favorable characteristics by depositing the oxide semiconductor film while heating a substrate or by performing heat treatment after an oxide semiconductor film is formed.

By intentionally heating the substrate after formation of the oxide semiconductor film including In, Sn, and Zn, the field-effect mobility of the transistor can be improved. Further, the threshold voltage of the transistor can be positively shifted to obtain a state closer to a normally-off state. Here, "obtaining a state closer to a normally-off state" means shifting the threshold voltage in the positive direction.

Figure 20A:
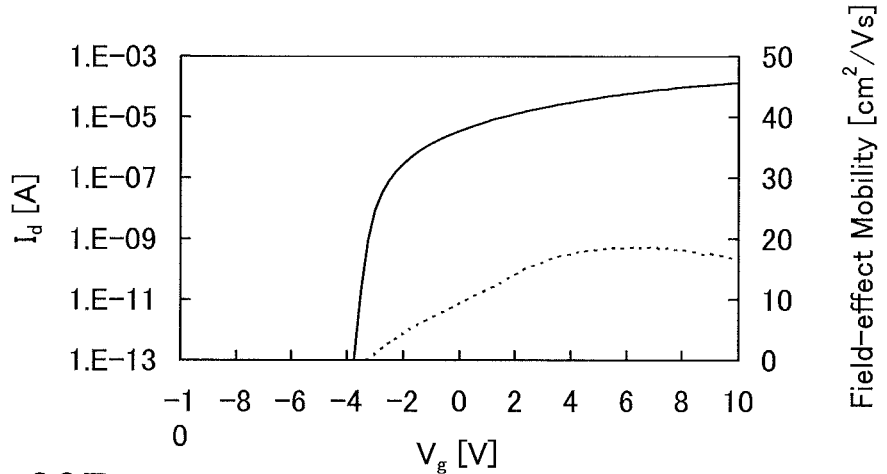
FIGS. 20A to 20C are graphs each showing characteristics of a transistor including an oxide semiconductor film.
Figure 20B:
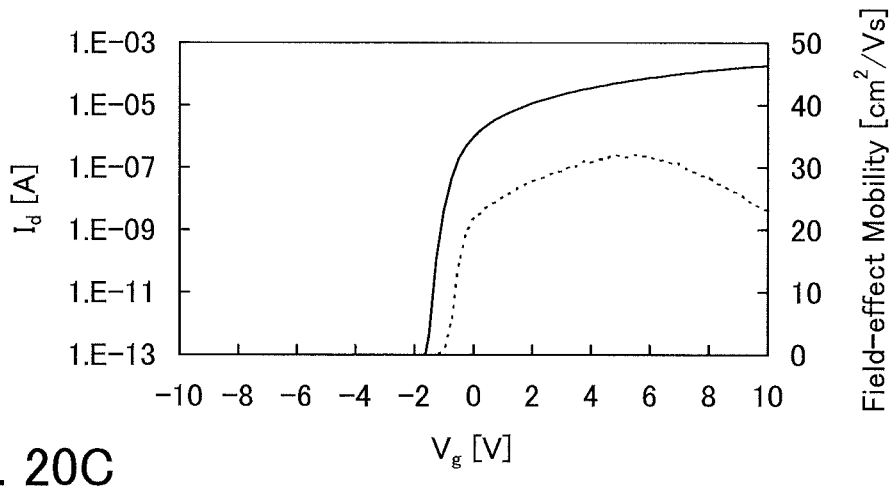
Figure 20C:
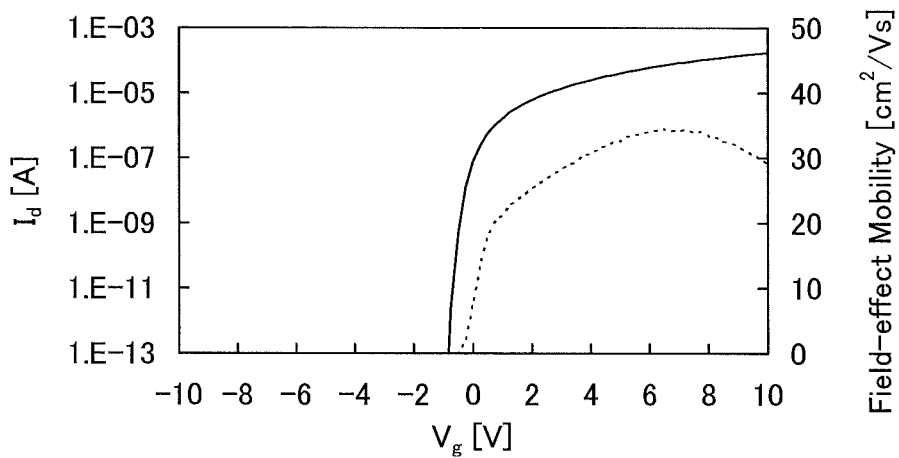

For example, FIGS. 20A to 20C each show characteristics of a transistor that uses an oxide semiconductor film including In, Sn, and Zn. As for the measured transistor, the channel length L was 3 μm, the channel width W was 10 μm, and the thickness of a gate insulating film was 100 nm. Note that $V_d$ was set to 10 V.

FIG. 20A shows characteristics of a transistor whose oxide semiconductor film including In, Sn, and Zn was formed by a sputtering method without heating a substrate intentionally. The field-effect mobility of the transistor is 18.8 cm$^2$/Vs. On the other hand, when the oxide semiconductor film including In, Sn, and Zn is formed while heating the substrate intentionally, the field-effect mobility can be improved. FIG. 20B shows characteristics of a transistor whose oxide semiconductor film including In, Sn, and Zn was formed while heating a substrate at 200° C. The field-effect mobility of the transistor is 32.2 cm$^2$/Vs.

The field-effect mobility can be further improved by performing heat treatment after formation of the oxide semiconductor film including In, Sn, and Zn. FIG. 20C shows characteristics of a transistor whose oxide semiconductor film including In, Sn, and Zn was formed by sputtering at 200° C. and then subjected to heat treatment at 650° C. The field-effect mobility of the transistor is 34.5 cm$^2$/Vs.

The intentional heating of the substrate is expected to have an effect of reducing moisture taken into the oxide semiconductor layer during the formation. Further, the heat treatment after film formation enables hydrogen, a hydroxyl group, moisture, or the like to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor film can be crystallized by being purified by removal of impurities from the oxide semiconductor. In the case of using such a purified non-single crystal oxide semiconductor film, ideally, a field-effect mobility exceeding 100 cm$^2$/Vsec is expected to be realized.

The oxide semiconductor film including In, Sn, and Zn may be crystallized in the following manner oxygen ions are implanted into the oxide semiconductor film, hydrogen, a hydroxyl group, moisture, or the like included in the oxide semiconductor film is released by heat treatment, and the oxide semiconductor film is crystallized through the heat treatment or by another heat treatment performed later. By such crystallization treatment or recrystallization treatment, a non-single crystal oxide semiconductor film having favorable crystallinity can be obtained.

The intentional heating of the substrate during film formation and/or the heat treatment after the film formation contributes not only to improving field-effect mobility but also to obtaining a state closer to a normally-off state of the transistor. In a transistor in which a channel formation region is included in an oxide semiconductor film that includes In, Sn, and Zn and that is formed without heating a substrate intentionally, the threshold voltage tends to be shifted negatively. However, when the oxide semiconductor film formed while heating the substrate intentionally is used, the problem of the negative shift of the threshold voltage can be solved. That is, the threshold voltage is shifted to obtain a state closer to a normally-off state of the transistor; this tendency can be confirmed by comparison between FIGS. 20A and 20B.

Note that the threshold voltage can also be controlled by changing the composition ratio of In, Sn, and Zn; when the composition ratio of In, Sn, and Zn is 2:1:3 in an atomic ratio, it is expected to obtain a state closer to a normally-off state of the transistor. In addition, an oxide semiconductor film having high crystallinity can be obtained by setting the composition ratio of a target as follows: In:Sn:Zn=2:1:3 (in an atomic ratio).

The temperature of the intentional heating of the substrate or the temperature of the heat treatment is 150° C. or higher, preferably 200° C. or higher, further preferably 400° C. or higher. When film formation or heat treatment is performed at a high temperature, a state closer to a normally-off state of the transistor can be obtained.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

The heat treatment can be performed in an oxygen atmosphere; alternatively, the heat treatment may be performed first in an atmosphere of an inert gas such as nitrogen or under reduced pressure, and then in an atmosphere including oxygen. Oxygen is supplied to the oxide semiconductor film after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor film or at an interface between the oxide semiconductor film and a film in contact with the oxide semiconductor film; however, when excess oxygen is included in the oxide semiconductor film by the heat treatment, oxygen deficiency caused constantly can be compensated for with excess oxygen. The excess oxygen is oxygen existing mainly between lattices. When the concentration of excess oxygen is set to higher than or equal to $1\times10^{16}/cm^3$ and lower than or equal to $2\times10^{20}/cm^3$, excess oxygen can be included in the oxide semiconductor film without causing crystal distortion or the like.

When heat treatment is performed so that a crystalline region is included in part of the oxide semiconductor film, a more stable oxide semiconductor film can be obtained. For example, when an oxide semiconductor film which is formed by sputtering using a target having an atomic ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an oxide semiconductor film including In, Sn, and Zn was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An oxide semiconductor film including In, Sn, and Zn with a thickness of 100 nm was formed over a quartz substrate that had been subjected to dehydrogenation treatment.

The oxide semiconductor film including In, Sn, and Zn was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 21:
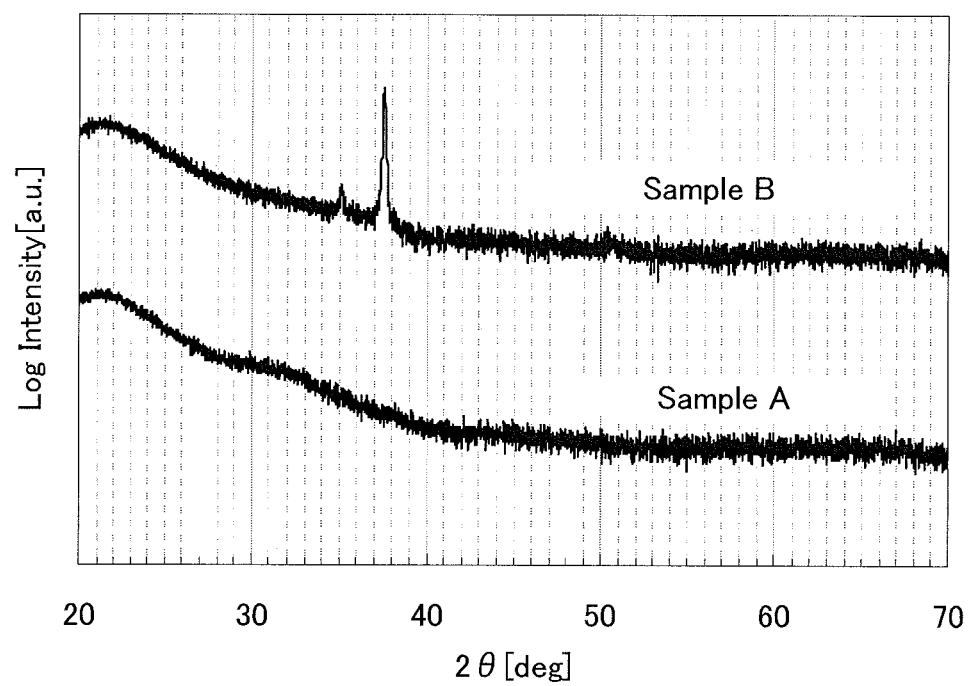
FIG. 21 shows XRD spectra of Sample A and Sample B.

FIG. 21 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating a substrate during deposition of an oxide semiconductor film including In, Sn, and Zn and/or by performing heat treatment after the deposition, characteristics of a transistor can be improved.

These substrate heating and heat treatment have an effect of preventing hydrogen, a hydroxyl group, moisture, and the like, which are unfavorable impurities for an oxide semiconductor film, from being included in the film or an effect of removing such unfavorable impurities from the film. That is, an oxide semiconductor film can be purified by removing hydrogen, a hydroxyl group, moisture, and the like serving as a donor impurity from the oxide semiconductor film, whereby a state closer to a normally-off state of the transistor can be obtained. The purification of an oxide semiconductor film enables the off-state current of the transistor to be 1 aA/μm or lower. Here, the unit of the off-state current is used to indicate current per micrometer of a channel width.

Figure 22:
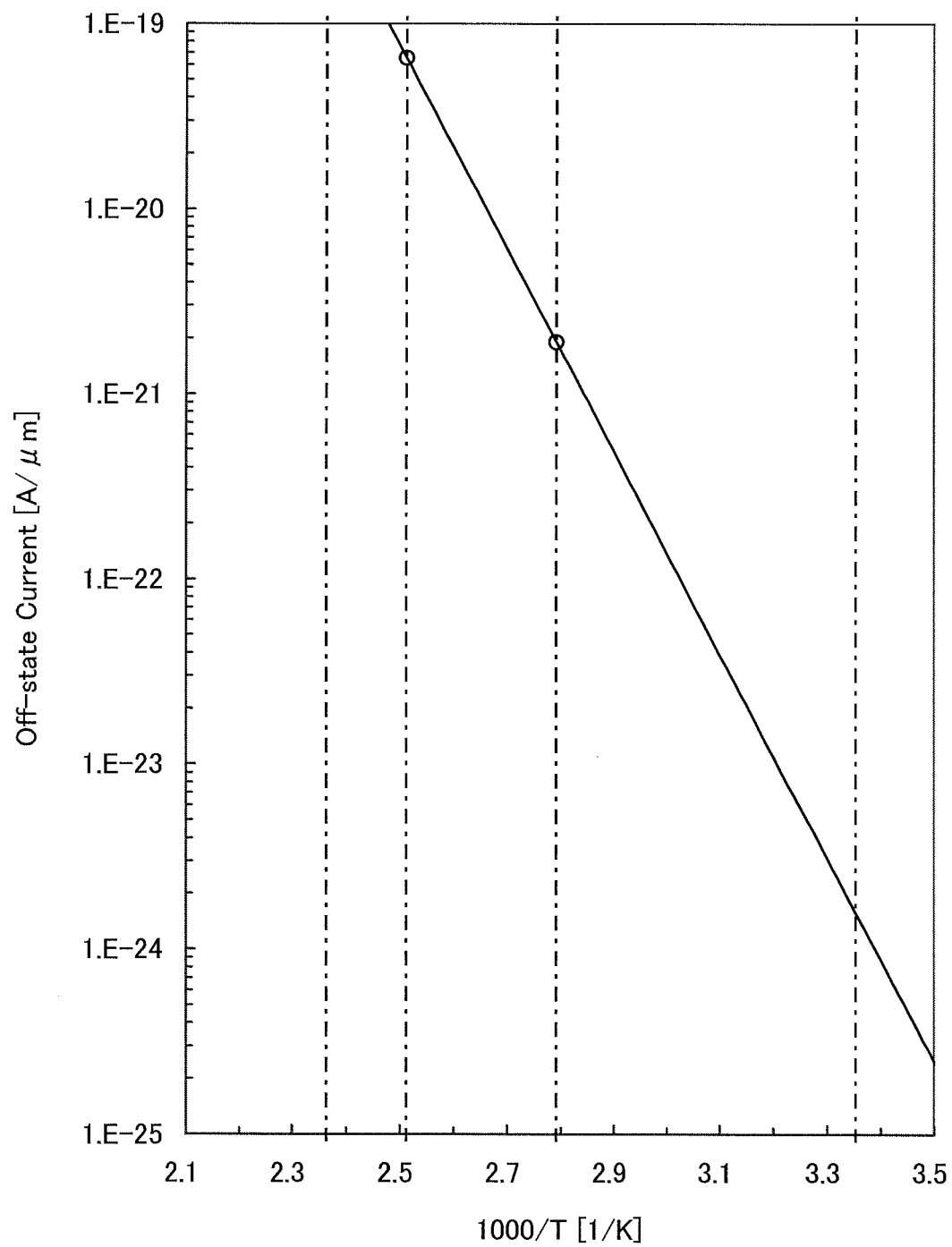
FIG. 22 shows a relation between off-state current and substrate temperature in measurement of a transistor.

FIG. 22 shows a relation between the off-state current of a transistor that uses an oxide semiconductor film including In, Sn, and Zn and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 22, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively. The above values of off-state currents are clearly much lower than that of the transistor using silicon as a semiconductor film.

Note that in order to prevent hydrogen, a hydroxyl group, moisture, and the like from being included in the oxide semiconductor film during formation thereof, it is preferable to increase the purity of a gas used for the formation by sufficiently suppressing leakage from the outside of a deposition chamber and degasification through an inner wall of the deposition chamber. For example, a gas with a dew point of −70° C. or lower is preferably used as the gas used for the formation in order to prevent moisture from being included in the film. In addition, it is preferable to use a target which is purified so as not to include impurities such as hydrogen, a hydroxyl group, moisture, and the like. Although it is possible to remove moisture from an oxide semiconductor film including In, Sn, and Zn by heat treatment, a film which does not include moisture originally is preferably formed because moisture is released from the oxide semiconductor film including In, Sn, and Zn at a higher temperature than from an oxide semiconductor film including In, Ga, and Zn.

The relation between the substrate temperature and electrical characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that measurement of electrical characteristics was performed at substrate temperatures of −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 23:
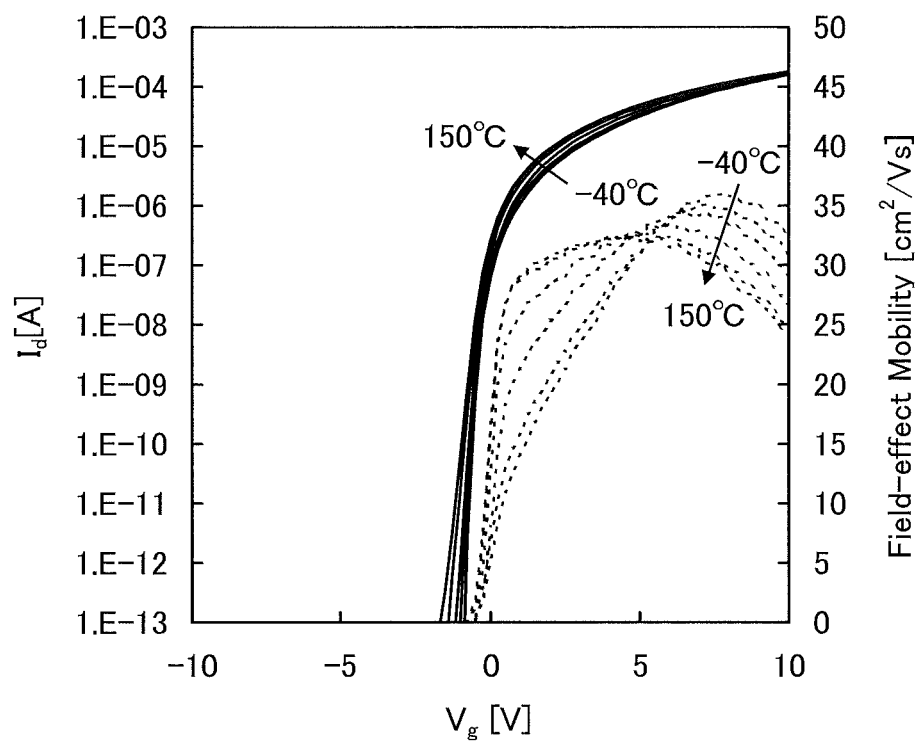
FIG. 23 shows $V_g$ dependence of $I_d$ and field-effect mobility.
Figure 24A:
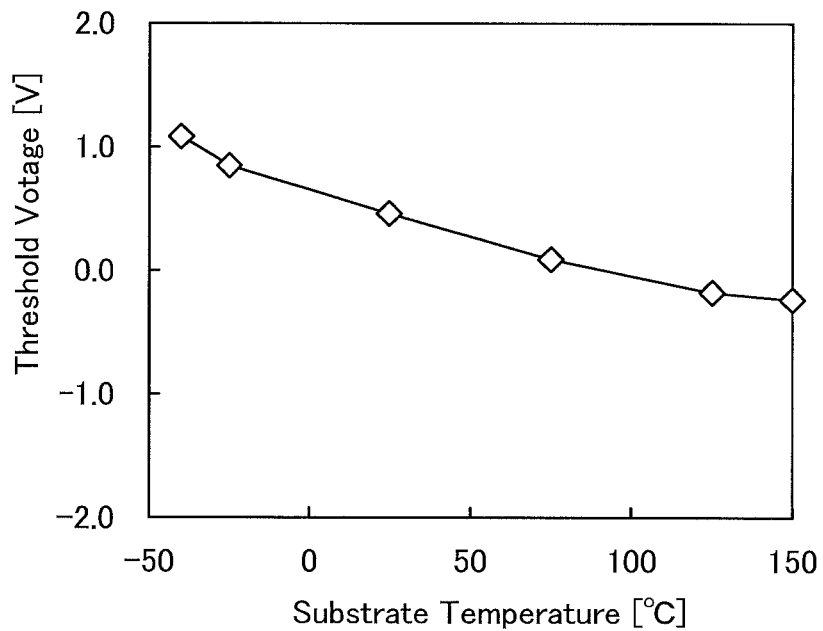
FIG. 24A shows a relation between substrate temperature and threshold voltage and FIG. 24B shows a relation between substrate temperature and field-effect mobility.

FIG. 23 shows the $V_g$ dependence of $I_d$ (a solid line) and field-effect mobility (a dotted line). FIG. 24A shows a relation between the substrate temperature and the threshold voltage, and FIG. 24B shows a relation between the substrate temperature and the field-effect mobility.

From FIG. 24A, it is found that the threshold voltage gets lower as the substrate temperature increases. Note that the threshold voltage is decreased from 1.09 V to −0.23 V in the range from −40° C. to 150° C.

Figure 24B:
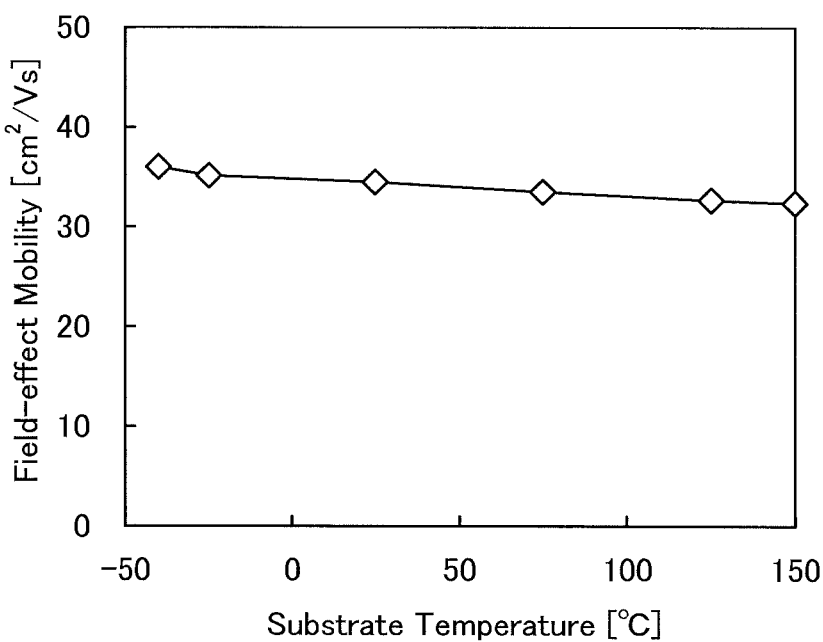

From FIG. 24B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electrical characteristics is small in the above temperature range.

In a transistor in which a channel formation region is included in such an oxide semiconductor film including In, Sn, and Zn, a field-effect mobility of 30 cm$^2$/Vs or higher, preferably 40 cm$^2$/Vs or higher, further preferably 60 cm$^2$/Vs or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor. With such characteristics, an integrated circuit having a novel function can be realized without decreasing the operation speed even when a transistor that uses an oxide semiconductor film is also provided in an integrated circuit formed using a silicon semiconductor.

Manufacturing Example 1

In this manufacturing example, an example of a transistor that uses an oxide semiconductor film including In, Sn, and Zn will be described with reference to FIGS. 25A and 25B and the like.

Figure 25A:
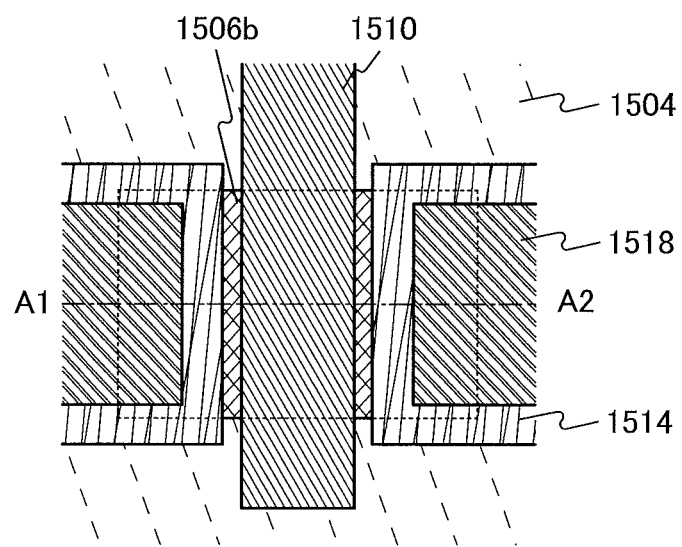
FIGS. 25A and 25B are a top view and a cross-sectional view, respectively, of a semiconductor device.
Figure 25B:
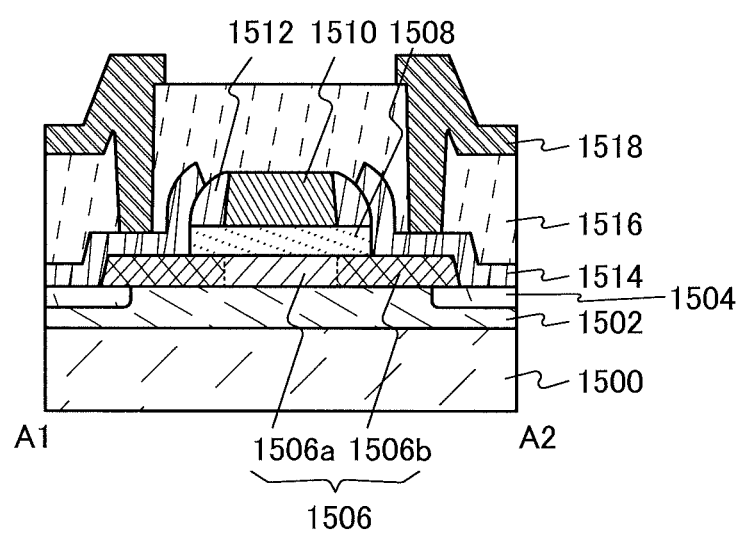

FIGS. 25A and 25B are a top view and a cross-sectional view of a transistor having a top-gate top-contact structure. FIG. 25A is the top view of the transistor. FIG. 25B is a cross-sectional view along dashed-dotted line A1-A2 in FIG. 25A.

The transistor illustrated in FIG. 25B includes a substrate 1500; a base insulating film 1502 provided over the substrate 1500; a protective insulating film 1504 provided in the periphery of the base insulating film 1502; an oxide semiconductor film 1506 provided over the base insulating film 1502 and the protective insulating film 1504 and including a high-resistance region 1506a and low-resistance regions 1506b; a gate insulating film 1508 provided over the oxide semiconductor film 1506; a gate electrode 1510 provided to overlap with the oxide semiconductor film 1506 with the gate insulating film 1508 positioned therebetween; a sidewall insulating film 1512 provided in contact with a side surface of the gate electrode 1510; a pair of electrodes 1514 provided in contact with at least the low-resistance regions 1506b; an interlayer insulating film 1516 provided to cover at least the oxide semiconductor film 1506, the gate electrode 1510, and the pair of electrodes 1514; and a wiring 1518 provided to be connected to at least one of the pair of electrodes 1514 through an opening formed in the interlayer insulating film 1516.

Although not illustrated, a protective film may be provided to cover the interlayer insulating film 1516 and the wiring 1518. With the protective film, a minute amount of leakage current generated by surface conduction of the interlayer insulating film 1516 can be reduced and thus the off-state current of the transistor can be reduced.

Manufacturing Example 2

In this manufacturing example, an example of a transistor that uses an oxide semiconductor film including In, Sn, and Zn, which is different from the example in Manufacturing Example 1, will be described.

Figure 26A:
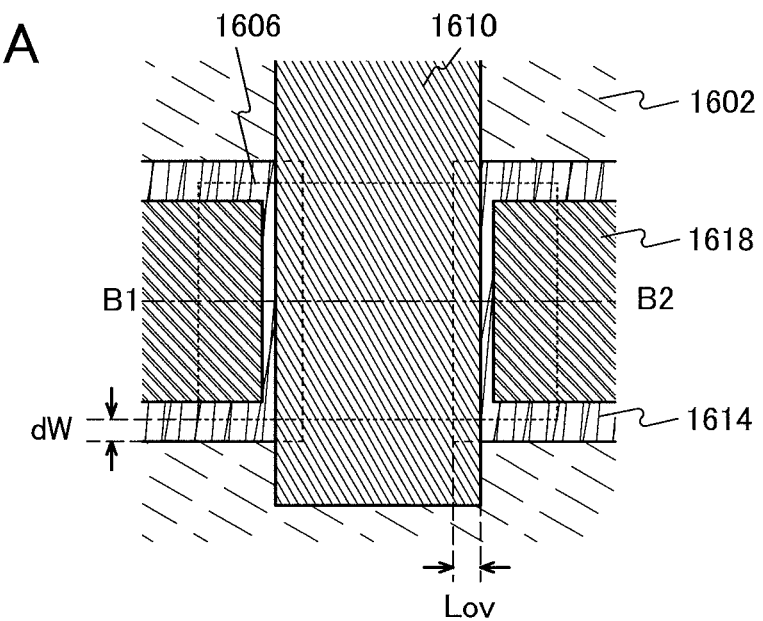
FIGS. 26A and 26B are a top view and a cross-sectional view, respectively, of a semiconductor device.
Figure 26B:
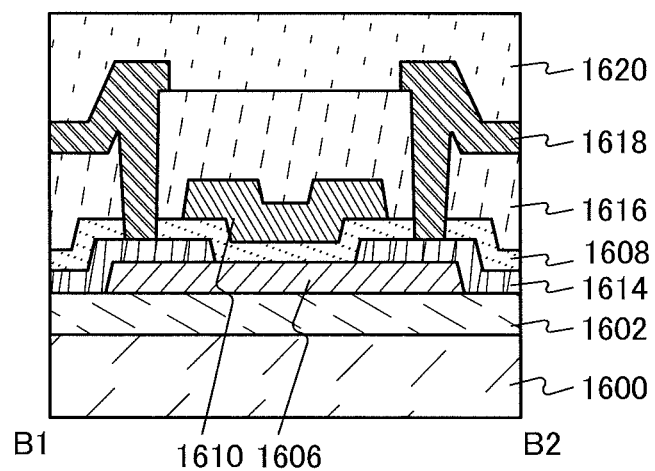

FIGS. 26A and 26B are a top view and a cross-sectional view illustrating the structure of a transistor manufactured in this manufacturing example. FIG. 26A is the top view of the transistor. FIG. 26B is the cross-sectional view along dashed-dotted line B1-B2 in FIG. 26A.

The transistor illustrated in FIG. 26B includes a substrate 1600; a base insulating film 1602 provided over the substrate 1600; an oxide semiconductor film 1606 provided over the base insulating film 1602; a pair of electrodes 1614 in contact with the oxide semiconductor film 1606; a gate insulating film 1608 provided over the oxide semiconductor film 1606 and the pair of electrodes 1614; a gate electrode 1610 provided to overlap with the oxide semiconductor film 1606 with the gate insulating film 1608 positioned therebetween; an interlayer insulating film 1616 provided to cover the gate insulating film 1608 and the gate electrode 1610; wirings 1618 connected to the pair of electrodes 1614 through openings formed in the interlayer insulating film 1616; and a protective film 1620 provided to cover the interlayer insulating film 1616 and the wirings 1618.

As the substrate 1600, a glass substrate can be used. As the base insulating film 1602, a silicon oxide film can be used. As the oxide semiconductor film 1606, an oxide semiconductor film including In, Sn, and Zn can be used. As the pair of electrodes 1614, a tungsten film can be used. As the gate insulating film 1608, a silicon oxide film can be used. The gate electrode 1610 can have a layered structure of a tantalum nitride film and a tungsten film. The interlayer insulating film 1616 can have a layered structure of a silicon oxynitride film and a polyimide film. The wirings 1618 can each have a layered structure in which a titanium film, an aluminum film, and a titanium film are formed in this order. As the protective film 1620, a polyimide film can be used.

Note that in the transistor having the structure illustrated in FIG. 26A, the width of a portion where the gate electrode 1610 overlaps with one of the pair of electrodes 1614 is referred to as Lov. Similarly, the width of a portion of the pair of electrodes 1614, which does not overlap with the oxide semiconductor film 1606, is referred to as dW.

This application is based on Japanese Patent Application serial no. 2010-242925 filed with Japan Patent Office on Oct. 29, 2010 and Japanese Patent Application serial no. 2011-113233 filed with Japan Patent Office on May 20, 2011, the entire contents of which are hereby incorporated by reference.

What is claimed is:

1. A semiconductor memory device comprising:
    a bit line;
    a plurality of word lines;
    a memory cell comprising a plurality of sub memory cells, the sub memory cells each comprising a first transistor and a capacitor;
    a second transistor;
    a third transistor;
    an amplifier;
    a first selection line;
    a second selection line; and
    a sub bit line,
    wherein a gate of the second transistor is electrically connected to the first selection line,
    wherein one of a source and a drain of the second transistor is electrically connected to the bit line,
    wherein the other of the source and the drain of the second transistor is electrically connected to a first terminal of the amplifier,
    wherein one of a source and a drain of the first transistor in each of the plurality of sub memory cells is electrically connected to the first terminal of the amplifier,
    wherein a second terminal of the amplifier is electrically connected to one of a source and a drain of the third transistor,
    wherein the other of the source and the drain of the third transistor is electrically connected to the bit line,
    wherein a gate of the third transistor is electrically connected to the second selection line,
    wherein the other of the source and the drain of the first transistor is electrically connected to the capacitor,
    wherein a gate of the first transistor is electrically connected to one of the plurality of word lines, and
    wherein capacitances of the capacitors in the plurality of sub memory cells are different from each other.

2. The semiconductor memory device according to claim 1, wherein a capacitance of a capacitor in a sub memory cell in the n-th row of the plurality of sub memory cells is $2^{n-1}$ times as large as a capacitance of a capacitor having a smallest capacitance of the capacitors, wherein n is a natural number.

3. The semiconductor memory device according to claim 1, wherein an active layer of the first transistor comprises an oxide semiconductor.

4. The semiconductor memory device according to claim 1, wherein the plurality of sub memory cells are provided to overlap with each other.

5. The semiconductor memory device according to claim 1, wherein the memory cell is overlapped with another memory cell having a function similar to that of the memory cell.

6. The semiconductor memory device according to claim 1, wherein a capacitance of a capacitor having a smallest capacitance of the capacitors is more than or equal to 0.1 fF and less than or equal to 1 fF.

7. The semiconductor memory device according to claim 1, wherein each of the plurality of sub memory cells comprises a DRAM.

* * * * *